(12) United States Patent
Lawton et al.

(10) Patent No.: US 8,871,133 B2
(45) Date of Patent: Oct. 28, 2014

(54) METHOD AND COMPOSITION FOR REDUCING WASTE IN PHOTO-IMAGING APPLICATIONS

(75) Inventors: John Lawton, Landenberg, PA (US); Jigeng Xu, Boothwyn, PA (US); John Southwell, Elgin, IL (US); Gordon Smith, Arlington, IL (US); Willem D. Weenink, Valkenswaard (NL)

(73) Assignee: DSM IP Assets B.V., Heerlen (NL)

( * ) Notice: Subject to any disclaimer, the term of this patent is extended or adjusted under 35 U.S.C. 154(b) by 0 days.

(21) Appl. No.: 13/424,995

(22) Filed: Mar. 20, 2012

(65) Prior Publication Data

US 2012/0178020 A1 Jul. 12, 2012

Related U.S. Application Data

(60) Continuation of application No. 12/656,395, filed on Jan. 28, 2010, now abandoned, which is a continuation of application No. 11/698,064, filed on Jan. 26, 2007, now abandoned, which is a division of application No. 11/047,773, filed on Feb. 2, 2005, now abandoned.

(51) Int. Cl.
*B29C 67/00* (2006.01)
*G03F 7/00* (2006.01)
*G03F 7/004* (2006.01)
*G03F 7/031* (2006.01)
*G03F 7/038* (2006.01)

(52) U.S. Cl.
CPC .............. *G03F 7/0037* (2013.01); *G03F 7/0048* (2013.01); *G03F 7/031* (2013.01); *G03F 7/0046* (2013.01); *G03F 7/038* (2013.01); *G03F 7/0045* (2013.01)
USPC .......................... 264/401; 264/494; 264/497

(58) Field of Classification Search
CPC ............ B29C 67/0055; B29C 67/0062; B29C 67/0066; B29C 67/007; B29C 67/0088
USPC .......................................... 264/494, 497, 401
See application file for complete search history.

(56) References Cited

U.S. PATENT DOCUMENTS

| | | | |
|---|---|---|---|
| 4,624,912 A | 11/1986 | Zweifel et al. |
| 4,885,319 A | 12/1989 | Dougherty et al. |
| 5,474,719 A | 12/1995 | Fan et al. |
| 5,667,937 A | 9/1997 | Lawton et al. |
| 5,707,780 A | 1/1998 | Lawton et al. |
| 5,975,893 A | 11/1999 | Chisti et al. |
| 6,099,787 A | 8/2000 | Melisaris et al. |
| 6,165,386 A | 12/2000 | Endo et al. |
| 6,177,232 B1 | 1/2001 | Melisaris et al. |
| 6,210,162 B1 | 4/2001 | Chisti et al. |
| 6,227,851 B1 | 5/2001 | Chisti et al. |
| 6,306,555 B1 | 10/2001 | Schulz et al. |
| 6,368,769 B1 | 4/2002 | Ohkawa et al. |
| 6,423,673 B1 | 7/2002 | Owens et al. |
| 6,610,759 B1 | 8/2003 | Chappelow et al. |
| 6,685,869 B2 | 2/2004 | Yamamura et al. |
| 6,743,943 B2 | 6/2004 | Anderson et al. |
| 6,764,725 B2 | 7/2004 | Engle et al. |
| 6,787,286 B2 | 9/2004 | Szmanda et al. |
| 6,833,231 B2 | 12/2004 | Moussa et al. |
| 6,835,533 B2 | 12/2004 | Foster et al. |
| 6,967,224 B2 | 11/2005 | Yamamura et al. |
| 6,977,131 B2 | 12/2005 | Tao |
| 7,256,221 B2 | 8/2007 | Coykendall et al. |
| 7,282,324 B2 | 10/2007 | Weber et al. |
| 2002/0032250 A1 | 3/2002 | Okazaki et al. |
| 2003/0175621 A1 | 9/2003 | Hinczewski |
| 2004/0013977 A1 | 1/2004 | Steinmann |
| 2004/0137368 A1 | 7/2004 | Steinmann |
| 2004/0224257 A1 | 11/2004 | Shibuya |
| 2005/0215757 A1 | 9/2005 | Kobayashi et al. |
| 2006/0063103 A1 | 3/2006 | Huang et al. |

FOREIGN PATENT DOCUMENTS

| | | |
|---|---|---|
| WO | 98/28663 | 7/1998 |
| WO | WO 0174919 A1 | 10/2001 |
| WO | 2005/070989 | 8/2005 |

OTHER PUBLICATIONS

Barath Baburao et al; "VLE/VLLE/LLE Predictions for Hydrogen Fluoride Mixtures Using an Improved Thermodynamic Equation of State", Ind. Eng. Chem. Res., 2002, vol. 412, pp. 4863-4872.
Omnova Solutions Inc., "Poly Fox T Polymer", Material Safety Data Sheet, May 8, 2001.
PolyFox PF-3320, "Fluorinated Oxetane Oligomer with Acrylate Functionality for Improved Performance, Flow Leveling, and Surface Appearance in UV and EB Coatings." (retrieved Oct. 21, 2004).
3 M Novec Fluorosurfactant FC-4430, Product Information, 2003.
R. P. Eckberg, "Radiation Curing in Polymer Scientce and Technology", Practical Aspects and Applications, vol. IV, pp. 20-33 and 3 cover pages, 1993.
"Polyfox, Fluorosurfactant Diols for Improved Flow, Leveling and Surface Appearance in Solvent Based Coatings.J", www.omnova.com/products/chemicals/documents/POLYFOX_diols_solvent_appsF. Jan. 23, 2007.

*Primary Examiner* — Timothy Kennedy
(74) *Attorney, Agent, or Firm* — Nixon & Vanderhye PC

(57) ABSTRACT

Waste reduction, including hazardous waste reduction in photoimaging processes can be accomplished by improving diffusional resolution of cationic curable compositions. The addition of fluorinated polymers including fluorinated surfactants provides improved diffusional resolution in cationic and/or radical based photoimaging formulations allowing for image accuracy improvements, and reduced product and process waste quantity and disposal cost. These fluorinated surfactants also allow for increased cure speed, and non-hazardous constituent formulations that result in less wasted material and time.

17 Claims, 30 Drawing Sheets

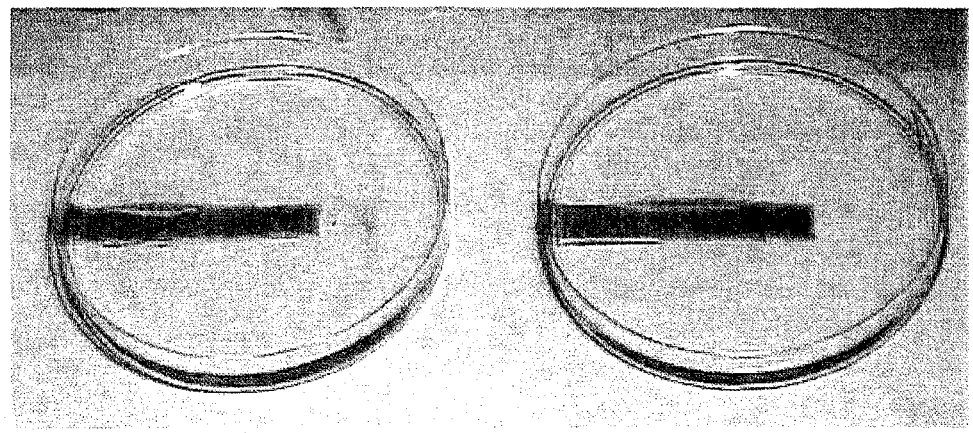
Figure 1Q                    Figure 1R
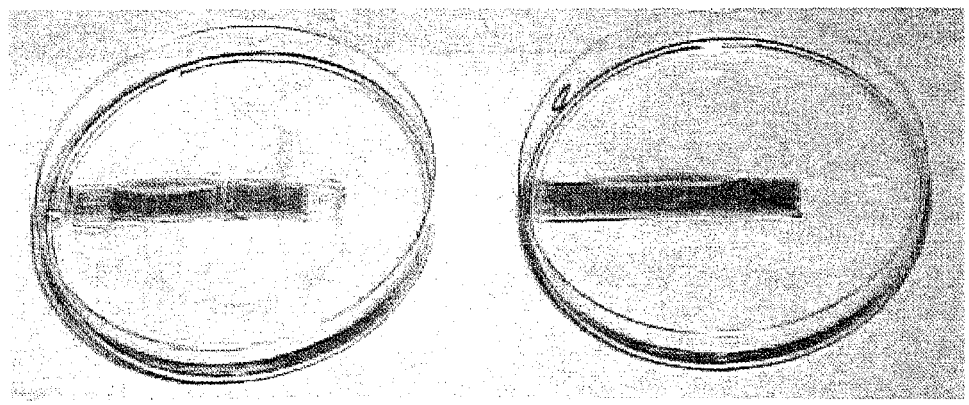
Figure 1S                    Figure 1T

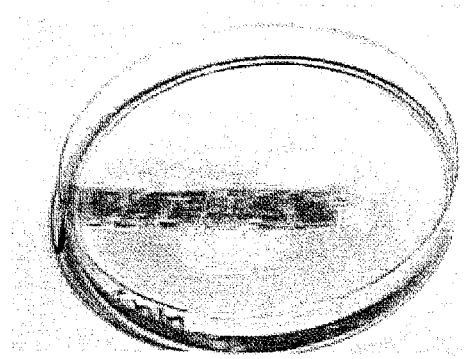 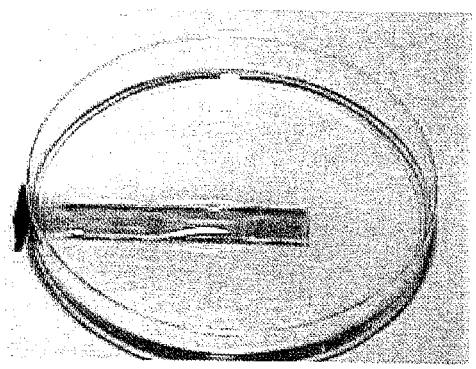
Figure 2E     Figure 2F
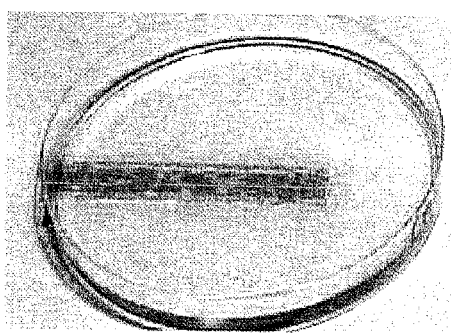 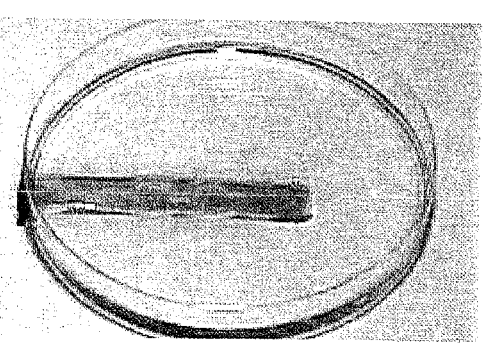
Figure 2G     Figure 2H

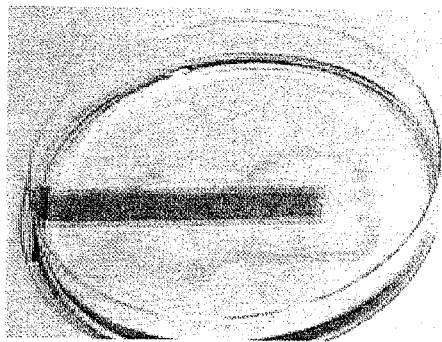 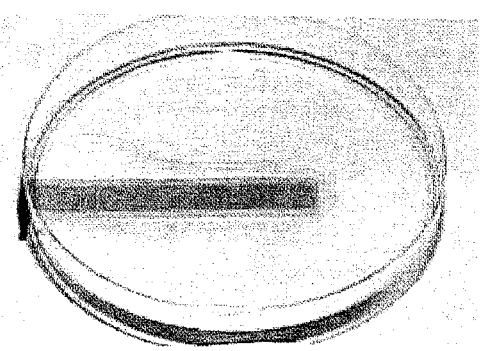
Figure 4E    Figure 4F
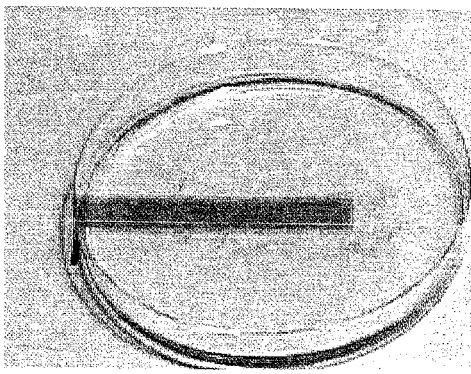 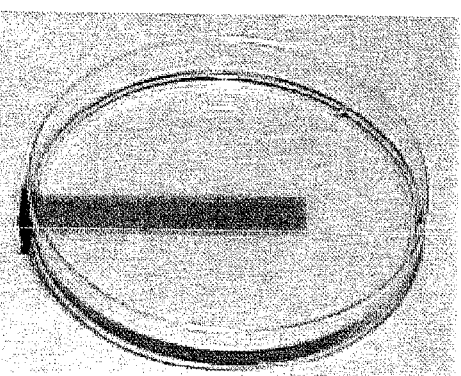
Figure 4G    Figure 4H

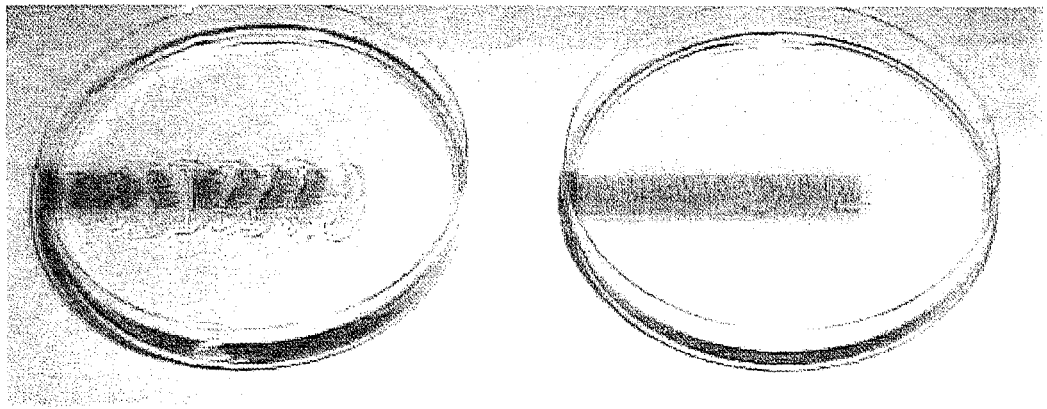
Figure 5EFigure 5F
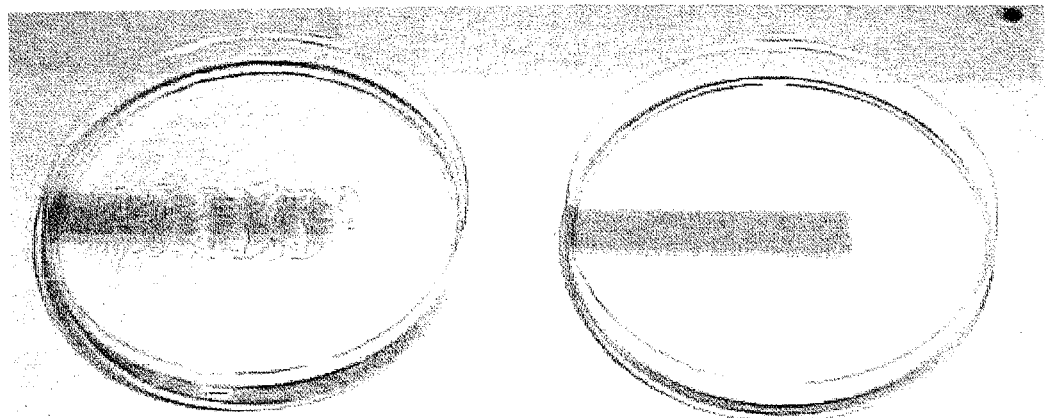
Figure 5GFigure 5H

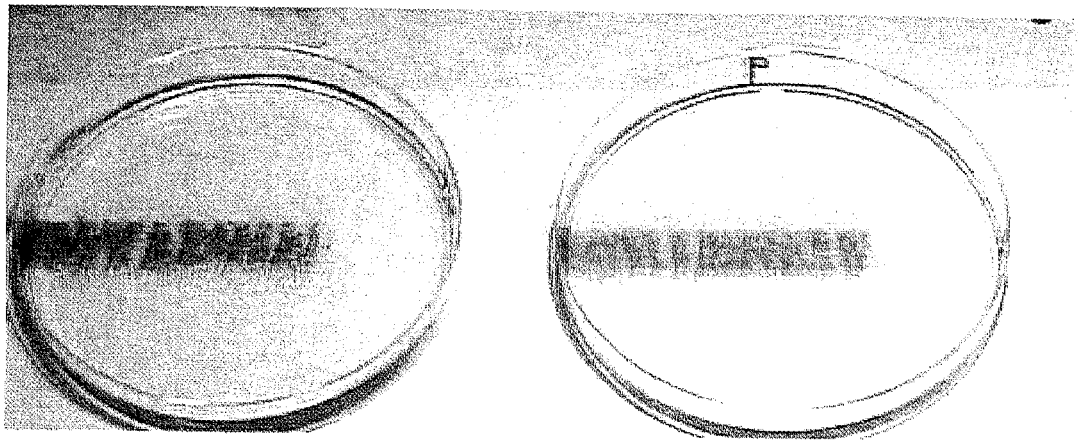
Figure 5IFigure 5J
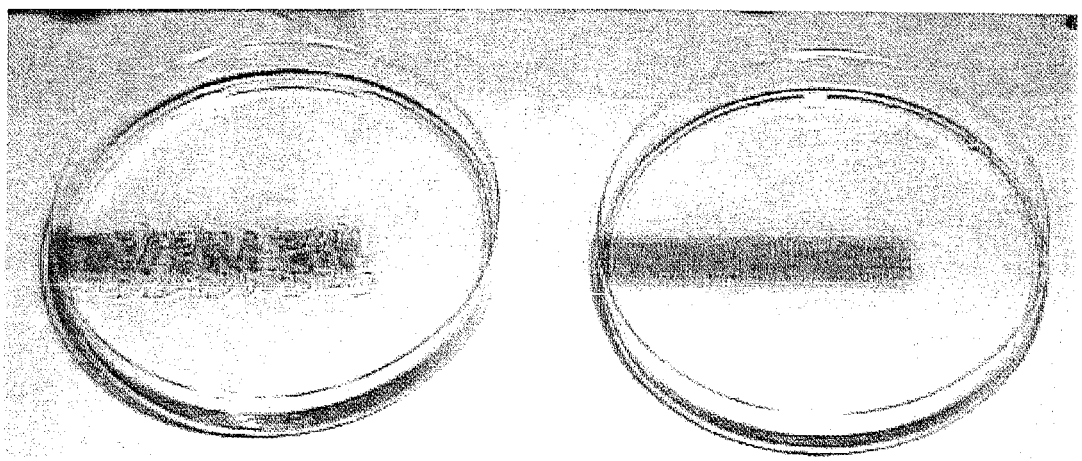
Figure 5KFigure 5L

METHOD AND COMPOSITION FOR REDUCING WASTE IN PHOTO-IMAGING APPLICATIONS

CROSS REFERENCE TO RELATED APPLICATION

This application is a continuation of U.S. application Ser. No. 12/656,395, filed Jan. 28, 2010 now abandoned, which is a continuation of U.S. application Ser. No. 11/698,064, filed Jan. 26, 2007 now abandoned, which in turn is a divisional of U.S. application Ser. No. 11/047,773, filed on Feb. 2, 2005 (now abandoned), the entire content of each application being expressly incorporated hereinto by reference.

BACKGROUND AND SUMMARY

This invention relates to novel cationic compositions and to methods of making and using the same. In preferred embodiments, the present invention relates to cationic compositions and methods which contribute to the reduction of hazardous waste production in photo-imaging and stereolithography The production of hazardous waste in the area of photoimaging can be related to several root causes. One of these causes can be poor image resolution at the edges of the imaging region. Poor image resolution can result in wasted hazardous materials. By improving diffusional resolution of such products, it is possible to reduce the volume of waste produced in various imaging processes. A second cause has been the lack of commercially viable non-hazardous compositions.

Within the field of stereolithography, cationically and mixed cationic/free radical (hybrid) formulations are utilized. Many cationic and hybrid formulations utilize initiators that include antimonate salts. Use of more environmentally friendly and in some cases non-hazardous constituent cationic initiators, for example phosphorous-based cationic initiators, has been undesirable primarily due to poor cure speed but also, in part, due to poor diffusional resolution. There are many factors that are believed to contribute to undesirable diffusional resolution including slow cure speeds and diffusion of activated materials from the image region.

U.S. Pat. No. 6,787,286 Szmanda et al. describes photoresist formulations where the solids content of the composition varies between about 5 and 35 percent by weight of the total weight of the photoresist composition, and more typically 5 to about 12 or 15 weight of the total weight of the photoresist composition, in which it is suggested that some degree of photoacid diffusion is affected by use of a basic additive.

U.S. Pat. No. 6,165,386 Endo et al. describe the use of Kayacure BMS ([4-methylphenylthio)phenyl]phenylmethanone) as a photosensitizer for free-radical formulations. Likewise a product brochure by Chitec, "Additives for UV Curing, Photoinitiator & Photosensitizer", describes use of Chivacure® BMS (4-Benzoyl-4'-methyldiphenyl sulfide) as a sensitizer for free radical systems.

U.S. Pat. No. 5,474,719 Fan et al. describe a stereolithography process wherein excess composition is removed using an air knife in order to form uniform layers of composition during part fabrication.

The present invention is embodied broadly in cationically curable compositions comprising a cationically curable component, a cationic initiator; and at least one of (i) a photosensitizing effective amount of a benzoyl diphenyl sulfide compound, or (ii) a photoacid diffusion inhibiting effective amount of a fluorinated surfactant.

In especially preferred embodiments, the compositions of the invention will comprise both the photosensitizer and the fluorinated surfactant.

One especially preferred cationically curable composition of this invention will comprise (a) a cationically curable component, (b) a cationic initiator; (c) a benzoyl diphenyl sulfide compound, and (d) a fluorinated surfactant.

Preferred embodiments will include a photosensitizer having substantially no light absorption above 400 nm and an extinction coefficient of 300 liters/mole-cm or greater. The photosensitizer is most preferably present in an amount to provide a depth of penetration ($D_p$) of between about 0.01 to about 0.03 cm. Exemplary embodiments will employ the photosensitizer in amounts between about 0.01% to about 1.0% by weight of the composition exclusive of filler weight. Most preferably, the photosensitizer employed in the compositions of the present invention will comprise 4-benzoyl-4'-methyldiphenyl sulfide (sometimes more simply referenced below as BMS).

In other embodiments of the invention, the compositions will comprise a fluorinated surfactant in an amount of between about 0.0001 wt. % to about 5 wt. %. In some embodiments of the invention, the compositions will include a fluorinated surfactant which contains at least one fluorinated moiety $C_pF_m$, where p is from 1 to 4 and m is from 3 to 12. Preferably, the fluorinated surfactant is a fluorinated ether.

In other embodiments of the invention, the fluorinated surfactant is at least one selected from the fluorinated surfactants of Structure 1 and Structure 2:

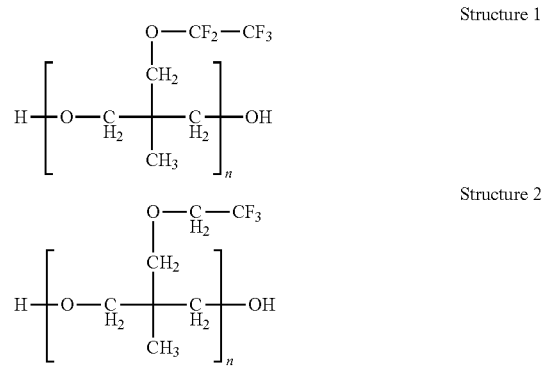

wherein n is 6 or greater. Preferably n is lower then 100.

The cationically curable component employed in embodiments of the invention preferably comprises at least one of epoxide-containing compounds, and hydroxyl-functional compounds. In another aspect, the compositions of the present invention will further comprise an oxetane. The compositions of the present invention in yet another aspect may include (meth)acrylate compounds.

In another aspect, the compositions of the invention may comprise at least one cationic initiator selected from the group consisting of iodonium compounds and sulphonium compounds. In preferred embodiments, the iodonium compound may comprise (tolylcumyl)iodoniumtetrakis(pentafluorphenyl)borate.

In another aspect, the present invention is embodied in a method of forming a cationically cured material comprising subjecting the cationically curable composition to cationic curing conditions for a time sufficient to form a cured material therefrom. Especially preferred embodiments of the invention are methods of forming a three-dimensional article by means of stereolithography by (1) coating a layer of the cationically curable composition as described herein onto a surface; (2) exposing the layer imagewise to actinic radiation to form an imaged cross-section, wherein the radiation provides sufficient exposure to cause substantial curing of the layer in the exposed areas; (3) coating a layer of the composition onto the previously exposed imaged cross-section; (4) exposing the layer from step (3) imagewise to actinic radiation to form an additional imaged cross-section, wherein the radiation is of sufficient intensity to cause substantial curing of the layer in the exposed areas and to cause adhesion to the previously exposed imaged cross-section; and (5) repeating steps (3) and (4) a sufficient number of times in order to build up the three-dimensional article.

This invention also provides for reducing the production of non-hazardous, hazardous or hazardous constituent wastes from use of photocurable cationic compositions. In one aspect, this waste reduction is achieved by improving the imaging of a cationic composition, such as by improving the diffusional resolution and/or the layer formation of such compositions by including photoacid diffusion inhibitors in the composition. By improving the diffusional resolution of such compositions, there is less waste produced and greater composition reuse potential in applications such as stereolithography. In particular, the disclosed methods and compositions can be useful in fabricating, for example, molds using stereolithography that can be used in vacuum molding processes for the production of thermoplastic articles.

In one embodiment, a high solids cationic composition for use in photoimaging applications and for reducing waste can include a photoacid diffusion inhibitor.

In another embodiment a method of improving diffusional resolution in a high solids cationic composition for photoimaging can include limiting diffusion of a photoacid in the composition. This can be accomplished by forming an association between a cationic photoinitiator and a photoacid diffusion inhibitor.

In another aspect, a method of reducing waste from stereolithographic processes can include mixing a photoacid diffusion inhibitor with a stereolithographic composition.

Another aspect includes a mold for production of articles that includes a cationic composition and a photoacid diffusion inhibitor. In another aspect, a method of producing molded articles can include forming a mold using a cationic composition and forming a thermoplastic film using the mold.

In yet another aspect, a stereolithographic composition can include a high solids composition and a fluorinated polymer, where the stereolithographic composition is non-hazardous.

In another aspect, a cationic composition for reducing waste production can include an oxetane, and a boron-containing, cationic photoinitiator or a phosphorous-containing cationic photoinitiator. The composition can be antimony-free. The composition can also include epoxides such as glycidyl epoxides, (meth)acrylates, hydroxyl-containing compounds and any combinations thereof. The composition can have no significant absorbance above 400 nm. The composition can also include a free radical initiator. In another aspect a method of reducing waste production from stereolithographic processes can include curing a portion or all of a cationic composition.

In another aspect, a method of cleaning stereolithographic articles can include removal of excess stereolithographic composition from the articles using an air knife or using liquid or supercritical $CO_2$.

In yet another aspect, a method of forming stereolithographic articles can include forming an article from a high solids cationic composition, removing excess composition material from the formed article, separating, such as by filtering or using centrifugation or another form of centrifugal force, the removed excess material and recycling the removed excess material.

BRIEF DESCRIPTION OF DRAWINGS

FIG. 1Q-1R show an approximately 1 cm×10 cm cured strip of a composition formed from control composition 1 (Q) and control composition 1 with 0.001% Polyfox 6520 fluorinated surfactant (R) after cure.

FIG. 1S-1T show an approximately 1 cm×10 cm cured strip of a composition formed from control composition 1 (S) and control composition 1 with 0.005% Polyfox 6520 fluorinated surfactant (T) after cure.

FIG. 2E-2F show an approximately 1 cm×10 cm cured strip of a composition formed from control composition 2 (E) and control composition 2 with 0.001% Polyfox 656 fluorinated surfactant (F) after cure.

FIG. 2G-2H show an approximately 1 cm×10 cm cured strip of a composition formed from control composition 2 (G) and control composition 2 with 0.1% Polyfox 656 fluorinated surfactant (H) after cure.

FIG. 4E-4F show an approximately 1 cm×10 cm cured strip of a composition formed from control composition 4 (E) and control composition 4 with 0.001% Polyfox 656 fluorinated surfactant (F) after cure.

FIG. 4G-4H show an approximately 1 cm×10 cm cured strip of a composition formed from (G) control composition 4 (G) and control composition 4 with 0.1% Polyfox 656 fluorinated surfactant (H) after cure.

FIG. 5E-5F show an approximately 1 cm×10 cm cured strip of a composition formed from control composition 5 (E) and control composition 5 with 0.001% Polyfox 656 fluorinated surfactant (F) after cure.

FIG. 5G-5H show an approximately 1 cm×10 cm cured strip of a composition formed from control composition 5 (G) and control composition 5 with 0.1% Polyfox 656 fluorinated surfactant (H) after cure.

FIG. 5I-5J show an approximately 1 cm×10 cm cured strip of a composition formed from control composition 5 (I) and control composition 5 with 0.001% FC 4430 fluorinated surfactant (J) after cure.

FIG. 5K-5L show an approximately 1 cm×10 cm cured strip of a composition formed from control composition 5 (K) and control composition 5 with 0.1% FC 4430 fluorinated surfactant (L) after cure.

DEFINITIONS

Figure 1A:
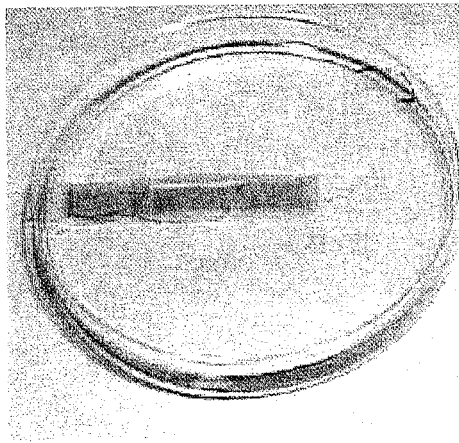
FIG. 1A-1B show an approximately 1 cm×10 cm cured strip of a composition formed from control composition 1 (A) and control composition 1 with 1% Polyfox 636 fluorinated surfactant (B) after cure.
Figure 1B:
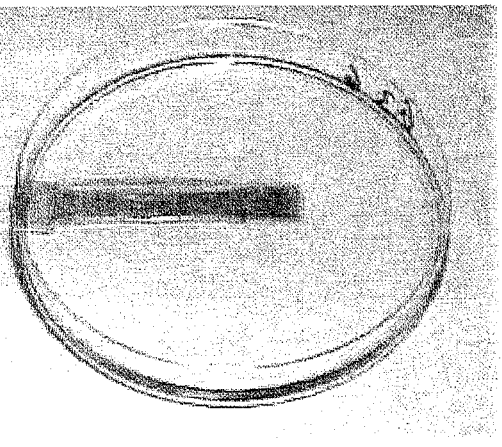
Figure 1C:
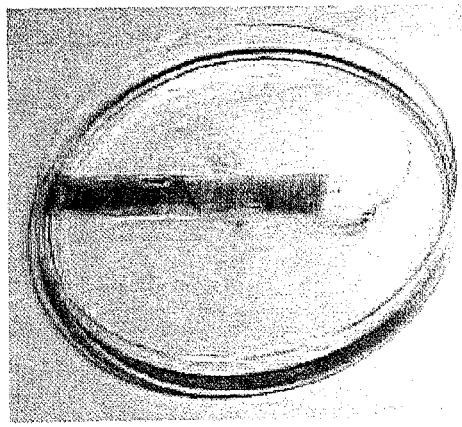
FIG. 1C-1D show an approximately 1 cm×10 cm cured strip of a composition formed from control composition 1 (C) and control composition 1 with 0.2% Polyfox 636 fluorinated surfactant (D) after cure.
Figure 1D:
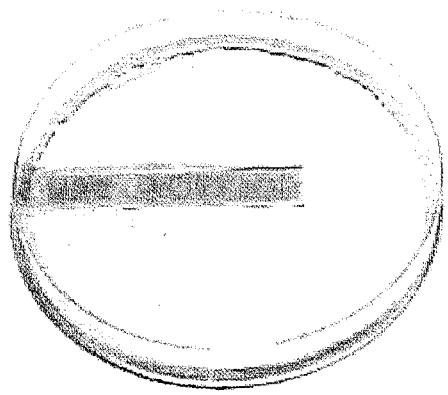
Figures 1E, 1F:
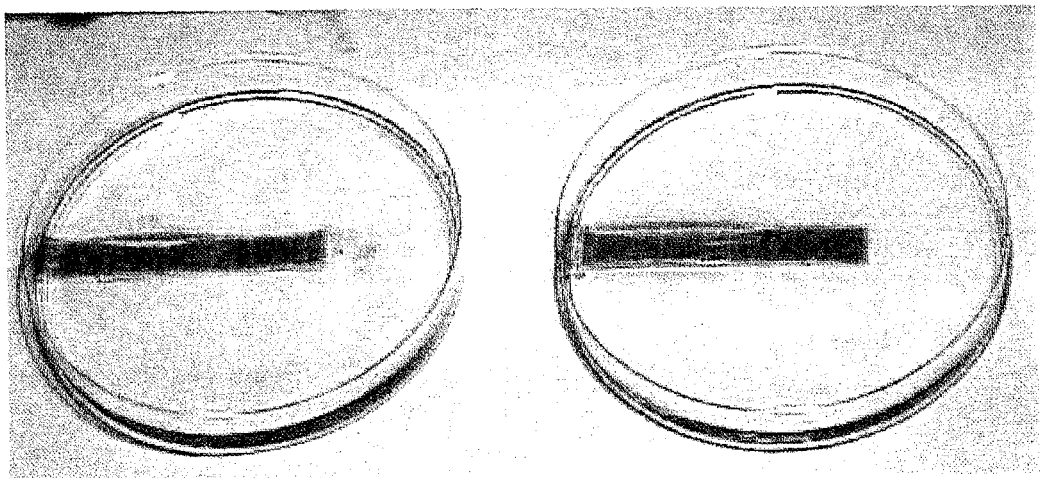
FIG. 1E-1F show an approximately 1 cm×10 cm cured strip of a composition formed from control composition 1 (E) and control composition 1 with 0.001% Polyfox 656 fluorinated surfactant (F) after cure.
Figures 1G, 1H:
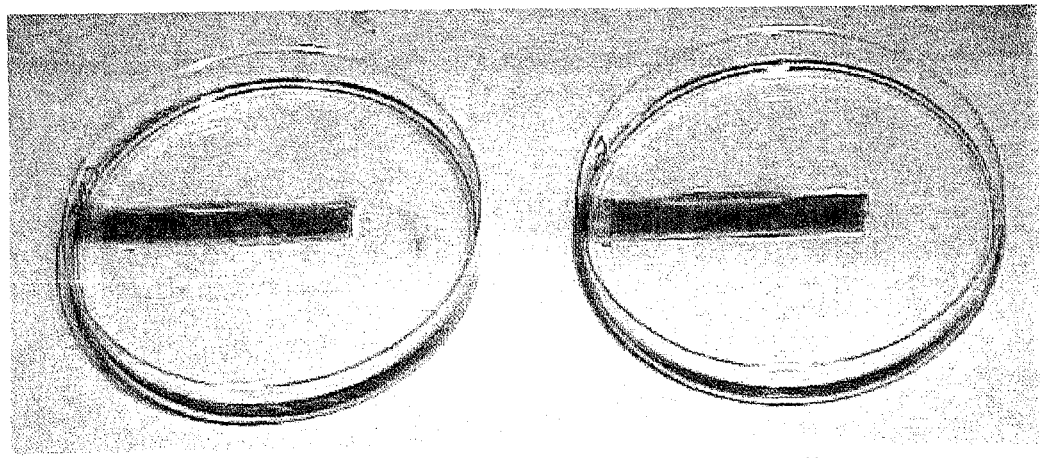
FIG. 1G-1H show an approximately 1 cm×10 cm cured strip of a composition formed from control composition 1 (G) and control composition 1 with 0.1% Polyfox 656 fluorinated surfactant (H) after cure.
Figures 1I, 1J:
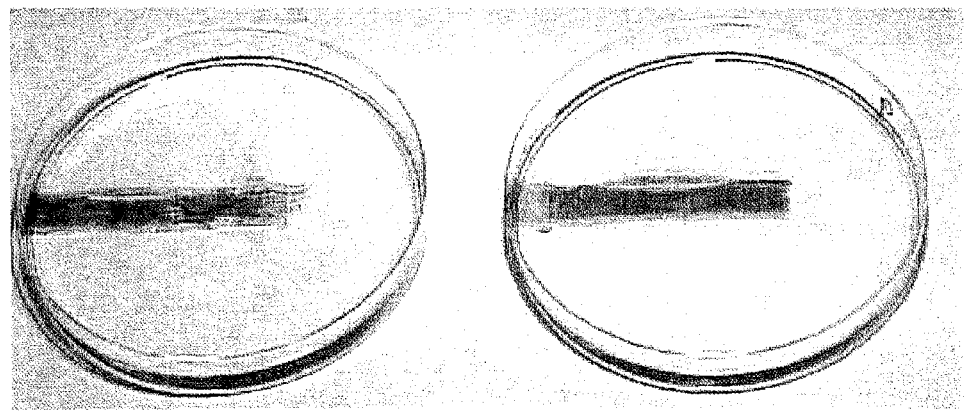
FIG. 1I-1J show an approximately 1 cm×10 cm cured strip of a composition formed from control composition 1 (I) and control composition 1 with 0.001% FC 4430 fluorinated surfactant (J) after cure.
Figures 1K, 1L:
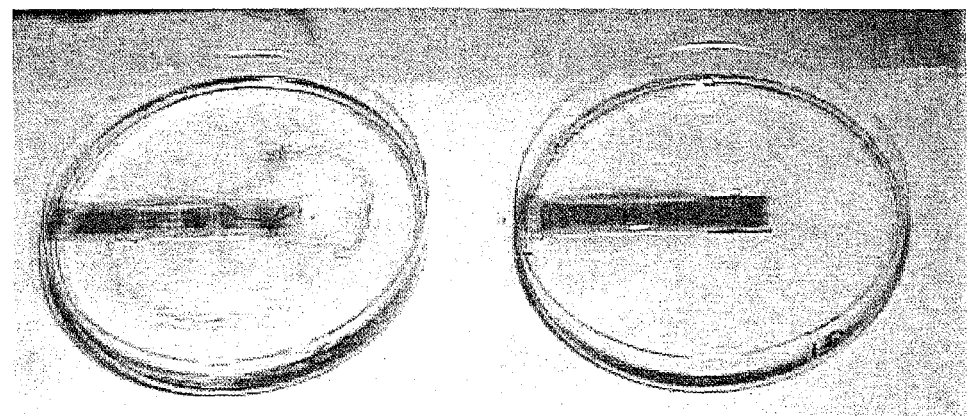
FIG. 1K-1L show an approximately 1 cm×10 cm cured strip of a composition formed from control composition 1 (K) and control composition 1 with 0.1% FC 4430 fluorinated surfactant (L) after cure.
Figures 1M, 1N:
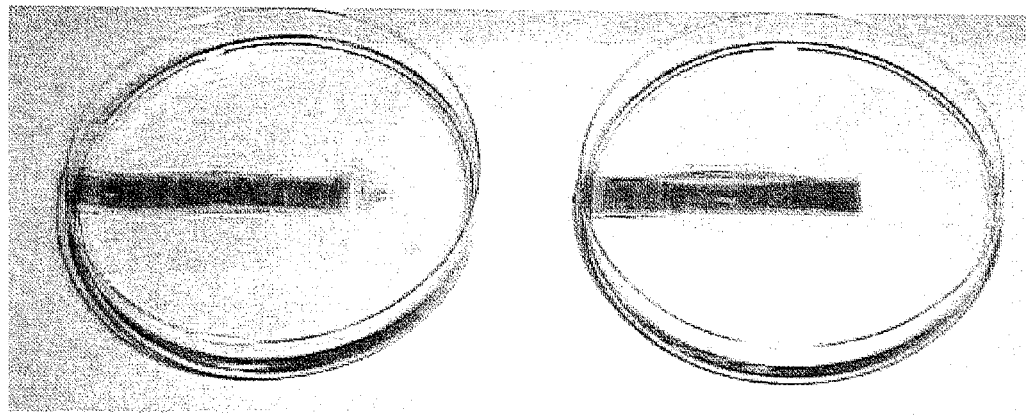
FIG. 1M-1N show an approximately 1 cm×10 cm cured strip of a composition formed from control composition 1 (M) and control composition 1 with 0.01% Polyfox 6320 fluorinated surfactant (N) after cure.
Figures 1O, 1P:
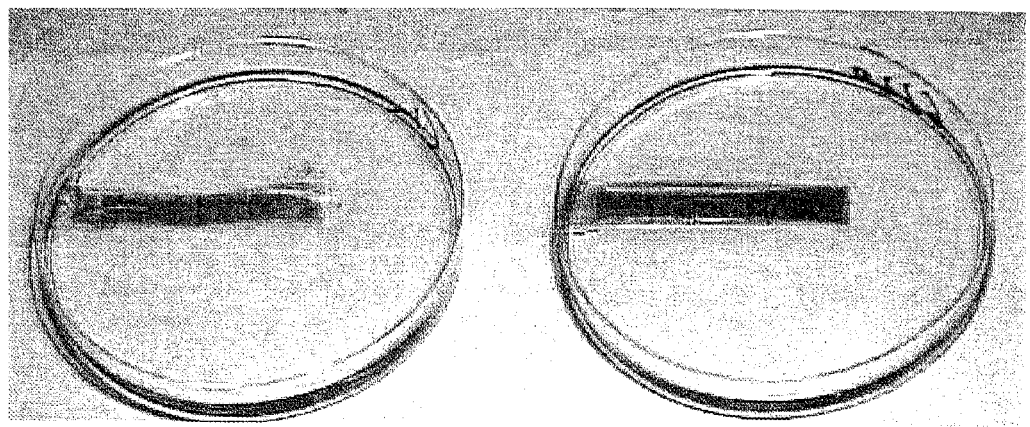
FIG. 1O-1P show an approximately 1 cm×10 cm cured strip of a composition formed from control composition 1 (O) and control composition 1 with 0.2% Polyfox 6320 fluorinated surfactant (P) after cure.

Certain terms, defined below, are used herein to define certain chemicals and concepts.

"Antimony-free" refers to compositions that contain greater than 98.5%, and preferably greater than 99%, and most preferably greater than 99.5% components that do not contain antimony in any form.

"Cationic composition" refers to a composition whose polymerization is initiated by the presence of cations. For example, compositions comprising cationic photoinitiators also referred to as photocationic compositions, which have polymerizations initiated by cations generated by exposure to actinic radiation.

"Diffusional resolution" refers to the accuracy and precision with which a photoimaged article formed from a composition can be recreated in the X-Y plane of a three-dimensional imaging process. For example, stereolithography diffusional resolution refers to the accuracy and precision of the reproduction of each individually imaged layer formed from a cationic composition, such as a cationic composition, most notably at the edges of each layer of the article.

"Fluorinated surfactant" refers to monomers and polymers containing at least one fluorinated moiety.

"Hazardous metals" refers to the following metals: arsenic, cadmium, chromium, copper, lead, nickel, silver, zinc, mercury, selenium, antimony, beryllium, or thallium.

"Hazardous organics" refers to the following organic materials: bromodichloromethane, bromoform, carbon tetrachloride, chlorobenzene, chloroethane, chloroform, chloromethane, dibromochloromethane, 1,2-dichlorobenzene, 1,3-dichlorobenzene, 1,4-dichlorobenzene, 1,1-dichloroethane, 1,2-dichloroethane, 1,1-dichloroethene, dichlorodifluoromethane, 1,2-dichloropropane, cis-1,3-dichloropropene, trans-1,3-dichloropropene, methylene chloride, 1,1,2,2-tetrachloroethane, tetrachloroethene, 1,1,1-trichloroethane, 1,1,2-trichloroethane, trichloroethene, vinyl chloride, Freon 113, benzene, ethyl benzene, toluene, and xylene.

"High solids" refers to a characteristic of a component, such as a composition, wherein greater than 35%, for example, greater than 50%, 75% and especially greater than 90%, of the material in said composition is chemically reactive to form an article by curing said composition.

"Hydrocarbyl" refers to a group containing only carbon and hydrogen.

"Non-hazardous" refers to material not present in, or if present, not present above certain limits specified by applicable EPA, state, or local municipality hazardous waste provisions.

"Non-hazardous metal" refers to metals other than hazardous metals and to low amounts of hazardous metals provided that the hazardous metals are present in amounts below 0.5 mg/L and preferably mounts below 1 ug/L.

"Non-hazardous organics" refers to organics other than hazardous organics and to low amounts of hazardous organics provided that the hazardous organics are present in amounts below 1 ug/ml and preferably in amounts below 0.5 ug/ml.

"Photoacid diffusion inhibitor" refers to compounds that inhibit or slow down diffusion of activated photoacid from a cationically activated composition. Preferred photoacid diffusion inhibitors include fluorinated compounds, e.g. fluorinated polymers and/or fluorinated surfactants, and/or fluorinated polymer surfactants.

"Saturated hydrocarbyl" refers to a hydrocarbyl group that is free of double or triple bonds. Examples of such groups include alkyl and cycloalkyl.

"Substituted hydrocarbyl" refers to a hydrocarbyl group that contains one or more substituent groups.

"Unsaturated hydrocarbyl" refers to a hydrocarbyl group that contains one or more double or triple bonds. Examples of such groups include olefinic, acetylinic or aromatic groups.

"Unsubstituted hydrocarbyl" refers to a hydrocarbyl that contains no substituent groups.

DETAILED DESCRIPTION

Within the photo-imaging field, there are at least two primary phenomena that affect image resolution. One phenomenon relates to the ability to focus the light energy applied. This will be called the optical resolution. Optical resolution can be a function of wavelength, focal length, Gaussian or non-Gaussian beam parameters, exposure, optic quality, photoreactive-medium light-scattering characteristics, medium absorption characteristics, bleaching (decreased absorbance upon exposure) or shading (increased absorbance upon exposure) of the absorbing species and other well known parameters.

The second phenomenon relates to the diffusion of photoinitiated species or diffusion of inhibition species. This phenomenon will be called diffusional resolution. Diffusional resolution can be related to viscosity, temperature, concentration gradient, polymerization reaction rate, polymerization exotherm, composition polarity, gellation time, initiator or sensitizer excited state lifetime, initiated species size, initiated species molecular weight, auto-acceleration of polymerization, inhibition means, inhibitor concentration, inhibitor mobility, solvent content and other known parameters. For example, when photo-imaging a square in the presence of oxygen in an acrylate composition, the corners of the square will tend to be rounded. The rounding is primarily due to the ability of oxygen to diffuse in and inhibit the free radical reaction. In the corners, oxygen can diffuse from many angles, but at the square edges, diffusion can only occur (in effect) from one direction that is normal to the edge. This corner rounding provides an example of the diffusional resolution phenomena.

Certain attributes of optical resolution are important to understand in order to distinguish the optical resolution effects from the diffusional resolution effects. For example when actinic light is focused imagewise on a surface, there is not a sharp on/off cutoff in light energy at the image edge. Rather the light diminishes gradually at distances from the image edge in the X-Y plane, often in a Gaussian manner toward the non-imaged region. At some distance from the theoretical image edge, the actinic exposure drops to a level that yields no or negligible reactive response from the photo-imageable medium. For example, if a color is formed by exposure, at some distance from the image edge there will be lack of color formation. As another example, if the photo-imageable medium converts from a liquid to a solid via photopolymerization, at some distance from the image edge the medium will no longer solidify. This is not to say that no color was formed or that no polymerization occurred. Rather, for example, the color may not be visible to the eye, or the polymerization at a distance from the edge progressed only to the extent that the reaction products were still soluble (a soluble gel) in the unexposed liquid, or the reaction products formed a weak gel or solid that could not withstand, for example, a subsequent washout process.

Such optical resolution may have a three-dimensional aspect in processes such as, for example, raised relief printing plates or stereolithography. As light penetrates into the depth of a photo-imageable medium, the light energy is absorbed. At some point the light energy is diminished such that, for example, a liquid photopolymer is no longer solidified. Just as in the case of a distance from an image edge, the photopolymer may be slightly gelled but soluble in the unexposed liquid or may be gelled such that it cannot withstand a cleaning process. The same would occur in cases of color formation. In cases where both color formation and solidification are occurring, as described in the Examples herein, it may be that color formation is more sensitive than solidification. That is, a color may form in a liquid in regions where the exposure was insufficient to cause solidification or gelling.

In situations where three-dimensional optical resolution is pertinent, the light intensity drop-off is exponential both in the Z (depth) dimension (due to absorption) and in the X-Y surface dimensions away from an image edge (due to the Gaussian intensity drop-off). However, the intensity decay rate may vary as a function of image focus (in the X-Y dimensions) or as a function of absorber concentration and extinction coefficient (in the Z dimension). In the case of the instant invention, the optical resolution outside the image edge is significantly greater than the optical resolution in the depth. For example, in stereolithography, it is common to use photopolymers, which have an absorption property called the Dp, typically expressed in mm or cm and typically on the order of 0.01 to 0.03 cm.

The Beer-Lambert Absorption Law (modified for use in stereolithography) can be written as:

$$I = Io \operatorname{Exp}(-I/Dp)$$

where: Io is the intensity of the actinic energy at the surface of the medium, and
I is the intensity of the actinic energy at depth $D_p$ in the medium.

Such an equation would define the optical resolution of a photoimageable medium as a function of depth Z or in this case I.

The optical resolution of a focused Gaussian beam in the X or Y dimension is expressed as:

$$I = Io \operatorname{Exp}(-2I/°_0)$$

where: Io is the intensity of the beam at the center or in this case the image edge, I (in X or Y) is the distance from the beam center or image edge center, and $°_0$ is the nominal $1/e^2$ beam radius.

Equating the original intensity Io of the beam impinging on the surface to be the same as the intensity of the beam at the image edge, and equating the distance I as either a depth Z or a distance from image edge X or Y, one can easily compare the optical resolution in depth to the optical resolution in the X and Y dimensions. For example, in a stereolithography formulation having a Dp of ~0.0138 cm and having a focused radius of ~0.0053 cm the following chart shows the calculated drop-off in intensity (expressed in % of original intensity) of the actinic radiation as a function of depth or distance from the image edge:

| Distance I Cm | I @ I Depth % | I @ I Dist Away % |
|---|---|---|
| 0.001 | 93.0 | 58.6 |
| 0.002 | 86.5 | 47.0 |
| 0.003 | 80.5 | 32.2 |
| 0.004 | 74.8 | 22.1 |
| 0.005 | 69.6 | 15.2 |
| 0.006 | 64.7 | 10.4 |
| 0.007 | 60.2 | 7.1 |
| 0.008 | 56.0 | 4.9 |
| 0.009 | 52.1 | 3.3 |
| 0.010 | 48.5 | 2.3 |
| 0.011 | 45.1 | 1.6 |
| 0.012 | 41.9 | 1.1 |
| 0.013 | 39.0 | 0.7 |
| 0.014 | 36.3 | 0.5 |
| 0.015 | 33.7 | 0.3 |

Based upon the parameters from the above example, it can be clearly seen that the optical resolution in depth is less than the optical resolution a distance away from an image edge. This is the approximate situation relative to the Dp of the experimental examples described herein and the focused beam diameter of the actinic radiation used to create the images. As will be seen, evidence of improved diffusional resolution will be apparent in the X and Y dimensions, which is where the optical resolution is best. Therefore, it is very easy to distinguish the difference between optical resolution and the diffusional resolution in X and Y. Any optical resolution deficiencies will be very close to the image edge and any remaining deficiencies will be apparent as diffusional resolution.

It has been found that that addition of surprisingly small amounts of a photoacid diffusion inhibitor to photosensitive compositions reduces diffusion out of the image region of reactive species. The reactive species can be generated by imagewise actinic exposure, and the photo acid diffusion inhibitor can be in the form of a fluorinated polymer, preferably a fluorinated surfactant, while the photosensitive composition, can be a photocationic composition. The fluorinated surfactant is effective at levels as low as 0.0001% in some cases, and has been used in levels of 0.0005%, 0.001%, 0.01%, 0.02%, 0.1%, 0.2%, 1% and higher. Unless the fluorinated surfactant or polymer is utilized as a reacted component in the formulation, it is preferred to utilize the fluorinated surfactant or polymer at wt. % levels of 5% or less, or preferably 1% or less, and most preferably 0.1% or less, or even 0.02% or less and 0.01% or less. The effectiveness of the fluorinated surfactant improves with increase in molecular weight. Higher molecular weight fluorinated surfactants require significantly lower concentration. The fluorinated surfactants improve in effectiveness with greater degree of fluorination. For example, a fluorinated surfactant with $C_2F_5$ moieties has superior performance when compared to one with $CF_3$ moieties. Such moieties are for example:

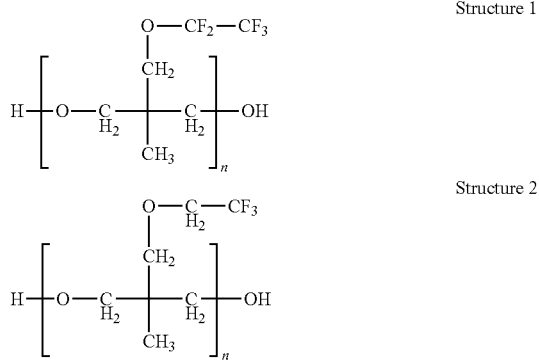

Structure 1

Structure 2 wherein the repeat group n is 6 or greater or more preferably n is 20 or greater.

Fluorinated surfactants with higher fluorination can be used at lower concentration to be effective for improving diffusional resolution. Preferable fluorinated moieties can generally be represented by $C_pF_m$, where p is from 1-4 and preferably from 1-2 and m is from 3-12 and more preferably from 3-5. Preferably, the fluorinated surfactants and polymers are soluble in the photosensitive composition and, in some cases, it is necessary to balance degree of fluorination against concentration in order to achieve sufficient surfactant or polymer solubility.

In the following examples, the reactive species are photo-generated acids and acid initiated polymerizations. These acids can be halogenated acids, from, for example, activated halogenated photoinitiators. Surprisingly, the addition of a fluorinated surfactant improves the diffusional resolution of not only fluorinated photoacids, but also chlorinated and brominated photoacids by inhibiting the diffusion of the photoacids out of the image region.

Also in the examples, the improvement in diffusional resolution of the cationic composition, obtained by addition of photoacid diffusion inhibitors such as a fluorinated surfactant, is exhibited by the reduction of, inhibition of, or near total elimination of diffusional photoproducts outside of the image region in the X and Y dimensions. It is also apparent that there is similar diffusional resolution improvement of the composition in the Z dimension since some examples exhibit improved uniformity in layer thickness and formation when a fluorinated surfactant is added.

Without being limited to a specific theory, it is suggested that the fluorinated surfactant forms a physical association with the halogenated photoacids, possibly both before and after actinic exposure. In this case, the association could have the effect of lowering the diffusivity and, perhaps, volatility of the photoacid or other reactants. This might explain why higher molecular weight fluorinated surfactants are more effective at low concentrations. It may also explain why higher fluorination improves the diffusional resolution since increased fluorination may increase the associative bonding. Such associative interactions could include, without limitation, any of the molecular interactions such as dipole formation, Van der Waals interactions, hydrogen bonding, solvent solute interactions, and other reduced surface tension interactions.

Although the use of fluorinated surfactants for the reduction of photoacid diffusivity is stressed within, it should be noted that the fluorinated surfactants are also useful in improving the diffusional resolution of halogenated free radicals from halogenated free radical photoinitiators and thus serve to inhibit free radical diffusion, as well as photoacid diffusion. For example, Chivacure 1176 (mixed Triaryl sulphonium salts of Hexafluoroantimonate dissolved in Propylene Carbonate obtained from Chitec Technology Co., Ltd. 7F, 58, Lane 148, Li De Street, Chung Ho, Taipei Hsien, 235, Taiwan, R.O.C.) is not only a powerful photoacid but also a free-radical generator. Or for example, Triazine Y (—S Triazine 2 (Stylbene) 4,6-Trichloromethyl (obtained from Charkit, 330 Post Road P.O. Box 1725 Darien, Conn., U.S.A.) is often used primarily as a free-radical initiator but also can be used as a photoacid generator. Each exhibits improved diffusional resolution when in the presence of fluorinated surfactants compared to when acting absent the fluorinated surfactant.

It can be noted that some cationic initiators have low absorption at the preferred actinic wavelength. For example, most stereolithography applications use 325 nm, 351 nm or 355 nm wavelengths, as these wavelength outputs are available employing commercially available and cost effective lasers. Iodonium salts, such as, for example, Rhodorsil 2074, available from Rhodia Silicones, Irgacure 250 Iodonium, (4-methylphenyl)[4-(2-methylpropyl)phenyl]-hexafluorophosphate(1-) available from Ciba, and UV9380c, available from GE Silicones, have insufficient direct absorption at the preferred wavelength and therefore require excessive concentration or require a sensitizer. It is known that free-radical photoinitiators such as, for example, Irgacure 184 and more preferably Irgacure 1173 can act as sensitizers for these iodonium salts. But concentrations of Irgacure 1173 in the range of ~11% are required for the correct absorption when using lasers operating at 355 nm, for example. Such concentrations are expensive and begin to reduce physical properties of the final photocured product. Therefore, triplet sensitizers such as thioxanthones and Michelers ketone are sometimes used to absorb the actinic energy and then transfer the energy to the iodonium initiator in an efficient manner. However, the thioxanthones and Michelers ketones are prone to orange or red color formation, safety concerns, and have significant actinic absorption beyond 400 nm, often out to 430 nm. Such absorption is not preferable in certain applications such as stereolithography, because special room light filters blocking light below 430 nm are needed to prevent premature polymerization of the composition due to room lighting. Light filters that block 430 nm and below create an undesirable yellow light environment.

The preferred sensitizer employed in the compositions of the present invention is a benzoyl diphenyl sulfide compound. Especially preferred are photosensitizers of the following formula:

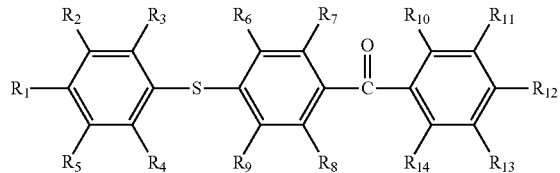

where $R_1$-$R_{14}$ can be, independently H or $C_1$-$C_8$ saturated or unsaturated, branched or unbranched, substituted or unsubstituted hydrocarbyl. Preferably $R_1$-$R_{14}$ are independently H or $C_1$-$C_4$ hydrocarbyl, for example $R_1$-$R_{14}$ are independently H or $CH_3$.

Especially preferred is 4-benzoyl-4'-methyldiphenyl sulfide (BMS). In this regard, BMS is an especially preferred sensitizer for iodonium initiators especially for use in stereolithography since it does not have significant light absorption above 400 nm and creates articles with less color. Although BMS can be used independently as a sensitizer, usually below 0.2%, it is more preferred to use BMS in conjunction with a free radical photoinitiator such as Irgacure 1173, especially in formulations containing (meth)acrylates. This is because the Irgacure 1173 is a more efficient free-radical photoinitiator. In order to reduce the concentration of sensitizers used in a formulation and prevent adverse effects that may result from relatively large concentrations of sensitizers on the final physical properties of the composition, it is preferable to use sensitizers with high extinction coefficients at commonly used laser wavelengths, for example, 325 nm, 351 nm or 355 nm. For example, benzophenone may, in some cases, act as a triplet sensitizer, but at laser wavelengths of, for example, a frequency tripled YAG laser (Coherent AVIA model #355-1800) operating at approximately 355 nm, the extinction coefficient is on the order of 108 liters/mole-cm. On the other hand, BMS using the same laser at the same laser wavelength of approximately 355 nm, has an extinction coefficient of almost 25 times that of benzophenone, 2585 liters/mole-cm. This suggests that BMS may require 1/25 the concentration in a formulation to provide an equivalent light absorption effect.

The concentration of a photosensitizer in a formulation is dependent upon many other factors such as the presence of: other absorbing species, for example photoinitiators, monomers, and dyes, etc.; the presence of light scattering components; the wavelength of use in the system; the depth of polymerization to be achieved; the solvent polarity; the degree and type of substitution on the photosensitizer moiety; the bleaching or shading as a result of absorber cleavage or addition; and so on. In general it is, preferable to have a photosensitizer concentration that makes the depth of penetration (commonly referred to in the stereolithographic art as $D_p$) to be on the order of the thickness of a layer of composition that is applied to a surface, or the depth to which polymerization is to be achieved by an actinic exposure. Preferably, the photosensitizer is employed in the compositions of this invention to achieve a $D_p$ of between about 0.01 to about 0.03 cm. For example, if a coated layer is approximately 0.015 cm thick, the Dp of the composition is preferably on the order of 0.005-0.025 cm. To achieve the preferred Dp range of approximately 0.01 to 0.03 cm utilizing 4-Benzoyl-4'-methyldiphenyl sulfide (BMS) in a clear non-absorbing monomer, absent other initiators, absorbers, or light scattering elements, in the working wavelength ranges of, for example 313-365 nm, a concentration of between 0.12% to 0.85% is preferably used. If however other absorbers, initiators, light scattering components, etc. were present, lower concentrations would preferably be used. Such concentrations might be as low as about 0.01% to about 0.8%. Overall therefore the photosensitizer is employed within a preferred range of between about 0.01% to about 1.0% by weight of the unfilled (i.e. lacking fillers, such as for example glass) composition.

Preferably, photosensitizers employed in the practice of this invention have an extinction coefficient greater than 300 liters/mole-cm, or higher such as greater than 1000 liters/mole-cm, and preferably greater than 2000 liters/mole-cm at laser wavelengths greater than 348 nm, for example 350 nm or more.

FIGS. 1-6 represent a series of petri dish experiments where a control strip of polymerized composition is shown on the left and a test strip of the exact same composition with a small amount of fluorinated surfactant added to the composition. These pictures, originally in color, were converted to black-and-white to help demonstrate the differences between the controls and the examples. The controls and examples were photographed in the same shot. In part, the pictures illustrate that a composition including a photoacid diffusion inhibitor, such as a fluorinated polymer, or a fluorinated surfactant has an improved diffusional resolution over a composition having the identical composition without the photoacid diffusion inhibitor.

In order to have improved diffusional resolution, it is preferred that the photosensitive formulation either be inherently gelled or substantially capable of gel formation shortly after exposure. For example, where simply color formation is desired, the photosensitive medium is preferably a gel to a fully solid medium. Alternatively, for example, where the photosensitive formulation is photohardenable, the exposure should quickly induce gel formation and or solidification. Highly solvated formulations, wherein the solvent is essentially non-reactive, comprising more than 35%, 25%, 15%, or 5% solvent are less preferred. As such the formulations of the instant invention are substantially solvent-free and are thus high solids compositions. That is, they contain greater than 35%, greater than 50%, greater than 75%, or 90% photoreactive components capable of gel or solid formation, or gel components, or solid components. Thus, for photoimaging and other processes, such as stereolithography, compositions can be high solids compositions, including high solids cationic compositions and high solids cationic photocurable compositions.

Control of diffusional resolution is especially important in stereolithography compared to other imaging applications. Stereolithography typically maintains a vat of photopolymer composition in which parts are imaged and then removed. The remaining composition that was not within the image region, or removed with the fabricated parts, is left in the vat and utilized for subsequent part builds. If diffused photoproducts such as gels are left in the vat, they may become hardened in fabricated parts, creating undesirable non-uniform properties within the fabricated parts. In addition, the diffused photoproducts may become attached to surfaces of the parts, forming undesirable surface defects, poor part accuracy, coating defects and build failures. If the diffused photoproducts are still reactive, as is the case with cationically cured compositions, the diffused photoproducts continue to grow or may initiate polymerization in the remaining unexposed composition. This leads to vat instability, viscosity rise, and may render the vat of composition eventually unusable. The addition of stabilizer may counteract this tendency, but continued production of diffused photoproducts soon consumes the stabilizer and would require constant replenishment of stabilizer. Furthermore, if significant diffusion of reactive species occurs out of the image region, the cure rate within the image is slowed since the concentration of reactive species is diminished by the diffusion. This might significantly reduce the green strength of laser fabricated parts, or may allow more time for hydrolysis of epoxide groups, or more time for monomer diffusion into the image region and other generally undesirable effects.

Diffusional resolution is harder to control in stereolithography than in other imaging applications since there tends to be a substantial variation in process temperature. Not only is the temperature of the composition changing as a function of, for example room temperature or build chamber temperature, but also the temperature of the vat of composition is changing due to the exotherm of polymerization as parts are fabricated. It is not unusual for vat composition temperatures to rise 3-5° C. near the image plane during a build process. And directly over a previously exposed image region, the temperature of the coated liquid will rise even higher. The rise in composition temperature has a significant effect on the resulting exotherm of cure. For example, a few degree change in initial composition temperature may cause a peak exotherm temperature to rise by 30° C. for some formulations. By stereolithography's nature during the build process, certain portions of the build have larger cured volumes than other parts of the build. As such the build process temperatures and the peak exotherm temperatures vary significantly. These higher temperatures lead to worsening diffusional resolution. The addition of fluorinated surfactants significantly improves the diffusional resolution despite these large variations in temperature.

The reaction rates and gel formation rates of a particular photopolymer system have a significant effect on diffusional resolution. In some cases the shrinkage of photopolymer systems is the same whether the composition be primarily comprised of epoxy monomers or acrylate monomers. However, in stereolithography, it has been found that epoxies have lower shrinkage distortion than acrylates and are therefore more preferred. One theory is that epoxies have a longer gel time prior to solidification than acrylates. This gel period allows shrinkage stresses to be relieved prior to the composition hardening thereby reducing shrinkage induced distortion. It has also been found that, for example, glycidyl epoxies are even more preferred since the gel time is longer than cycloaliphatic epoxies. However, this longer gel period also leads to worsened diffusional resolution, since the gel allows more of the reacted species to escape from the image region. The addition of fluorinated surfactants improves the diffusional resolution of epoxide and especially glycidyl epoxy compositions despite their increased gel time.

Improving diffusional resolution is an important step in managing the waste streams generated in stereolithographic and other imaging applications, including both non-hazardous and hazardous waste streams. Imaging applications that require removal of unexposed composition from exposed composition (or less polymerized composition from more hardened composition) in order to create a relief image (such as in electronic resists, printing plate, and stereolithography for example) generate a waste product from the removed component. Indeed, even the remaining relief image product becomes a waste product once its useful life has played out. Therefore, it is preferable, from an environmental perspective, to lower the amount of, for example, hazardous waste including hazardous constituent waste in the waste product.

Thus, it can be helpful to use stereolithographic compositions, having improved diffusional resolution derived from addition of a photoacid diffusion inhibitor, such as a fluorinated polymer or a fluorinated surfactant.

Improving diffusional resolution accomplishes waste reduction by, for example in stereolithography, reducing the amount of escaped diffused active species out of the image region and into the surrounding vat composition. Such escape would reduce the useful life of the unimaged surrounding composition, leading to a thickening of the composition to a point that it would have to be disposed of as a waste. Such escape can also slow the cure speed within the image region to the point that once a stereolithographic part has been fabricated it has poor green strength such that it deforms during the post processing, and must be disposed of as waste due to insufficient dimensional accuracy. In other industries where resolution is important, the improved diffusional resolution would allow production of more accurate images and therefore reduce the waste disposal of out of specification (due to poor image resolution) defective product. Consider, for example, that without the improved diffusional resolution, the colors in a color photograph would bleed and the photograph would be a blurred waste. With improved diffusional resolution, the colors would be distinct and the image would be sharper.

In stereolithography, all current cationically cured (including hybrid) commercial formulations utilize an antimonate based cationic photoinitiator. In some municipalities, objects fabricated from such compositions must be disposed of as a hazardous waste or hazardous constituent waste. Any unused composition whether resulting from a cleaning process, an obsolescence of the product, or a lack of viscosity stability must also be disposed of as a hazardous constituent waste. Therefore, there is a long felt but unfulfilled need for a commercial cationically curable stereolithography formulation that does not include hazardous constituents such as antimonate salts, i.e. that are antimony free. For example, in at least one state, there is a need for stereolithography compositions and cationic compositions that do not include hazardous metals or hazardous organics as previously defined herein.

The instant invention discloses cationic compositions that do not require antimonate based cationic initiators and work quite satisfactorily with phosphorus based and boron based cationic initiators. Although there are examples of stereolithographic compositions that utilize some types of phosphorous-based cationic initiators, none have been commercialized in the past because the cure rate of those compositions was insufficient for use in stereolithography. The slow cure rates can lead to distortion of parts during fabrication, swelling of the objects during fabrication due to surrounding monomer absorption, poor green strength of parts after laser fabrication prior to subsequent light or thermal post-cure, and for example, moisture absorption during the cleaning and post-processing phases of part fabrication. Such moisture absorption and/or monomer swelling can lead to loss of desirable properties such as image fidelity, and excessive hydrolysis of ester and epoxide groups. The slower cure rate can also result in worsened diffusional resolution. Addition of fluorinated surfactants significantly improves the diffusional resolution when non-hazardous constituent cationic photoinitiators are used in stereolithography formulations and, by reducing diffusion out of the image region, aids in the cure rate since a relatively higher amount of initiator concentration is retained within the image region.

Other cationic initiators that may be employed in the practice of this invention include sulphonium compounds. For example, phosphorous-based sulphonium photoinitiators may be employed such as UVI-6992 (Mixed triarylsulfonium hexafluorophosphate salts in propylene carbonate) available from Dow, or BF-1172:

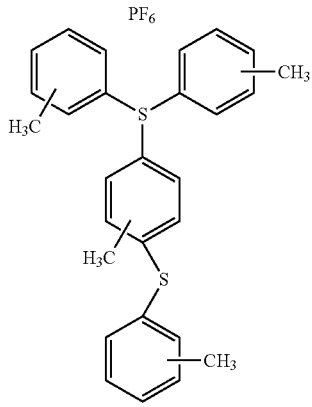

which is available from Chitec, can also be used with or without a sensitizer but are less preferred.

These antimony-free compositions are especially useful in that the contaminated wash materials used to remove the excess composition from the fabricated parts can be disposed of as a non-hazardous waste in many municipalities. The fabricated parts can also be disposed of as a non-hazardous waste (i.e., as a standard plastic). The composition, if it becomes too thick to use in the stereolithography process can be disposed of as a non-hazardous constituent waste in most municipalities. Alternatively, in order to reduce or eliminate the amount of contaminated wash solution, an air knife could be used to blow off the unexposed composition, which can then be recycled for use when possible. In addition, a surfactant could be added to the wash solution, which is soluble in the liquid and gel components to be removed but not soluble in the hardened portions of the parts. The surfactant could cause the unpolymerized portions to de-wet more easily from the polymerized portions. Alternatively, the parts could be cleaned in a cleaning solvent and then the waste composition-laden cleaning solvent could be distilled to recover the solvent and concentrate the waste composition thereby reducing hazardous material costs. The parts could also be placed in liquefied or supercritical $CO_2$ to dissolve off the waste composition. The waste composition laden liquid or supercritical $CO_2$ would then be moved to a decompression chamber where the $CO_2$ would be drawn off as a gas, leaving behind cleaned parts in one chamber and waste composition in another chamber. Preferably exposure to the liquid or supercritical $CO_2$ would be adjusted over a short period, for example less than an hour, to avoid decompression bubbles from forming within and destroying the fabricated parts.

The resin compositions of the present invention are preferably used in a layer by layer process wherein a three-dimensional object is prepared. Examples of such a process include stereolithography processes, ink jet processes, extrusion processes and the like. For example, one exemplary ink-jet process is one in which photopolymer is jetted or extruded imagewise and exposed with actinic radiation to harden the photopolymer. Another exemplary ink-jet or extrusion process is one wherein a non-actinic material is deposited in the negative of the image and a photopolymer is coated or jetted in the positive of the image and subsequently or simultaneously exposed to actinic radiation to harden the photopolymer. Processes similar to stereolithography may also be employed wherein exposures are made through a mask or reflected off a mask, either onto a photopolymer surface or through a clear surface, whereby such exposures substantially harden the photopolymer. A process for producing three-dimensional articles from the compositions of the invention, as discussed above, generally involves exposure of successive thin layers of the liquid composition to actinic radiation. A thin layer of the photosensitive composition of the invention is coated onto a surface. This is most conveniently done if the composition is a liquid. However, a solid composition can be melted to form a layer. The thin layer is then exposed imagewise to actinic radiation to form a first imaged cross-section. The radiation must provide sufficient exposure to cause substantial curing of the photosensitive composition in the exposed areas. By "substantial curing" it is meant that the photosensitive composition has reacted to an extent such that the exposed areas are physically differentiable from the unexposed areas. For liquid, gel or semi-solid photosensitive compositions, the cured areas will have hardened or solidified to a non-fluid form. For solid photosensitive compositions, the exposed areas will have a higher melting point than the non-exposed areas. Preferably, the exposure is such that portions of each successive layer are adhered to a portion of a previously exposed layer or support region, or to portions of a platform surface. An additional (second) thin layer of photosensitive composition is then coated onto the first imaged cross-section and imagewise exposed to actinic radiation to form an additional (second) imaged cross-section. These steps are repeated with the "nth" thin layer of photosensitive composition being coated onto the "(n−1)th" imaged cross-section and exposing to actinic radiation. The repetitions are carried out a sufficient number of times to build up the entire three-dimensional article.

The radiation is preferably in the range of 280-650 nm. Any convenient source of actinic radiation can be used, but lasers are particularly suitable. Useful lasers include HeCd, argon, nitrogen, metal vapor, and NdYAG lasers. The exposure energy is preferably in the range of 10-150 $mJ/cm^2$. Suitable methods and apparatus for carrying out the exposure and production of three-dimensional articles have been described in, for example, U.S. Pat. Nos. 4,987,044, 5,014,207, and 5,474,719, which teaches the use of pseudoplastic, plastic flow, thixotropic, gel, semi-solid and solid photopolymer materials in the solid imaging process.

In general, the three-dimensional article formed by exposure to actinic radiation, as discussed above, is not fully cured, by which is meant that not all of the reactive material in the composition has reacted. Therefore, there is often an additional step of more fully curing the article. This can be accomplished by further irradiating with actinic radiation, heating, or both. Exposure to actinic radiation can be accomplished with any convenient radiation source, generally a UV light, for a time ranging from about 10 to over 60 minutes. Heating is generally carried out at a temperature in the range of about 75-150° C., for a time ranging from about 10 to over 60 minutes. One commercializable application of the instant invention is the use of fluorinated surfactants in stereolithography composition compositions that are used to form molds for the molding of thermoplastic articles. An exemplary process for forming such molded parts with improved diffusional resolution from non-hazardous components could follow the following steps:

Fabricate objects via stereolithography in a manner similar to that described above and in the Examples below.

Clean the parts (possibly while still on the platform), removing excess composition, using, for example, a high-pressure water and soap washing apparatus.
1. Dry the parts.
2. Postcure the parts using a UV post exposure.
3. Place the parts in a vacuum-molding fixture.
4. Vacuum mold a heated thermoplastic film over the parts and allow the film to cool, thereby causing the thermoplastic film to conform to and retain the shape of the outer surface of the parts.

Alternatively, another commercial application of antimony-free compositions is in the production of patterns via stereolithography, for example, for investment casting. It is well known in the stereolithographic art that patterns, for example "Quick-Cast" patterns, can be made via stereolithography. Quick-Cast patterns have an outer skin that matches the perimeter of a part to be molded and also has an internal scaffold-like structure. The scaffold-like structure ensures suitable structural integrity for the skin but allows drainage of uncured resin from within the skin pattern. After fabrication of a Quick-Cast pattern via stereolithography, the pattern may be drained of internal uncured resin and then the pattern may be dipped in various ceramic slurry baths to build-up a pre-ceramic shell around the pattern. Next the pattern and pre-ceramic shell is heated and fired in various steps in order to harden the pre-ceramic into a ceramic investment casting mold. During this process, the pattern is burned out resulting in the ceramic investment cast mold.

Presently, the industry is concerned with antimony-containing stereolithographic patterns where there is sometimes a problem in that the antimony is not completely burned-out, specifically that some antimony content remains present with the ceramic mold. Then when a molten metal is poured into the ceramic shell, the antimony interacts with the metal producing metal parts with surface faults or metal alloy regions in the parts that have undesirable physical properties (e.g., a tendency to crack or a lower melting point). Such problems are more significant for superalloy parts, for example, for turbines that are cast for use in turbine engines. Consequently, the presence of antimony leads to increased waste from failed and discarded parts, ceramic shells, and alloy metal. The use of antimony-free stereolithographic compositions, such as those discussed herein, to produce these patterns would reduce such waste.

The following are suitable property ranges for compositions and cured articles including patterns and molds formed from compositions of the instant invention. These properties are important in reducing waste production, in that by creating parts that meet these properties, fewer parts fail and less waste is created as a result. The composition should have a viscosity of 3000 cps or less, more preferably 1500 or less, still more preferably 1000 or less, even more preferably 500 or less and even more preferably 300 or less. Similarly, suitable compositions should have a Dp of between 0.01-0.03 cm, more preferably 0.015-0.025 cm and even more preferably 0.017-0.023 cm. After hardening, the tensile modulus should be above 2.0 GPa, and more preferably above 2.2 GPa. Similarly, the maximum tensile % elongation should be above 3.5%, and more preferably above 4% and even more preferably above 5%. Finally, the E10 cure speed should be below 50 mJ/cm$^2$, and more preferably below 45 mJ/cm$^2$, and still more preferably below 40 mJ/cm$^2$.

Fluorinated surfactants can be added to stereolithography compositions to improve the diffusional resolution of the compositions. Common components include (meth)acrylates, epoxides, hydroxyl-containing monomers, oxetanes photoinitiators, free radical initiators, sensitizers, and other additives. Examples of each of these groups are provided below. Different combinations of these can be made with fluorinated polymers and can be used as stereolithography compositions or compositions for other photo-imaging applications.

(Meth)Acrylates

A component that can be used in a composition of the present invention can be a (co)polymer obtainable by (co) polymerizing a monomer comprising at least one (meth)acrylate group or a mixture of monomers comprising at least one monomer comprising a (meth)acrylate group. Specifically, the component may be one or more of (co)polymers selected from (1) a homopolymer of a (meth)acrylate group containing monomer, (2) a copolymer made from two or more (meth) acrylates group containing monomers, and (3) a copolymer made from one or more (meth)acrylates group containing monomers and one or more other monomers copolymerizable with the (meth)acrylate group containing monomer.

Given as examples of suitable (meth)acrylic esters are n-propyl (meth)acrylate, n-butyl(meth)acrylate, i-butyl (meth)acrylate, sec-butyl(meth)acrylate, tert-butyl(meth) acrylate, n-aminohexyl(meth)acrylate, 2-heptyl(meth)acrylate, octyl (meth)acrylate, 2-ethylhexyl(meth)acrylate, nonyl (meth)acrylate, decyl(meth)acrylate, dodecyl(meth)acrylate, hexadecyl(meth)acrylate, octadecyl(meth)acrylate, cyclohexyl (meth)acrylate, and phenyl(meth)acrylate. Although these (meth)acrylic acid esters may be used individually, combined use of two or more of them is more also suitable.

As monomers (copolymerizable monomers) other than (meth)acrylic acid esters for preparing the copolymer, vinyl compounds such as, for example, vinyl acetate, styrene, vinyl chloride, vinylidene chloride, acrylonitrile, vinyl toluene and acrylamide can be given.

Ethylenically unsaturated monomers can be used as a component in the composition of the present invention is a compound having an ethylenically unsaturated bond (C double bonded to another C) in the molecule, and includes monofunctional monomers containing one ethylenically unsaturated bond in one molecule and polyfunctional monomers containing two or more, and preferably three or more ethylenically unsaturated bonds in one molecule.

Examples of monofunctional monomers having one ethylenically unsaturated bond in the molecule include acrylamide, (meth)acryloylmorpholine, 7-amino-3,7-dimethyloctyl(meth)acrylate, isobutoxymethyl(meth)acrylamide, isobomyloxyethyl(meth)acrylate, isobornyl(meth)acrylate, 2-ethylhexyl(meth)acrylate, ethyldiethylene glycol (meth) acrylate, t-octyl(meth)acrylamide, diacetone (meth)acrylamide, dimethylaminoethyl(meth)acrylate, diethylaminoethyl (meth)acrylate, lauryl(meth)acrylate, dicyclopentadiene (meth)acrylate, dicyclopentenyloxyethyl(meth)acrylate, dicyclopentenyl(meth)acrylate, N,N-dimethyl(meth)acrylamide, tetrachlorophenyl(meth)acrylate, 2-tetrachlorophenoxyethyl (meth)acrylate, tetrahydrofurfuryl(meth)acrylate, tetrabromophenyl(meth)acrylate, 2-tetrabromophenoxyethyl (meth)acrylate, 2-trichlorophenoxyethyl(meth)acrylate, tribromophenyl(meth)acrylate, 2-tribromophenoxyethyl(meth) acrylate, 2-hydroxyethyl (meth)acrylate, 2-hydroxypropyl (meth)acrylate, vinylcaprolactam, N-vinylpyrrolidone, phenoxyethyl(meth)acrylate, butoxyethyl(meth)acrylate, pentachlorophenyl (meth)acrylate, pentabromophenyl(meth) acrylate, polyethylene glycol mono(meth)acrylate, polypropylene glycol mono(meth)acrylate, bornyl(meth)acrylate and methyltriethylene diglycol (meth)acrylate, and compounds shown by the following formulas (28)-(30). These compounds may be used either individually or in combination of two or more.

As examples of commercially available products of these monofunctional monomers, ARONIX M-101, M-102; M-111, M-113, M-117, M-152, TO-1210 (manufactured by Toagosei Co., Ltd.), KAYARAD TC-110S, R-564, R-128H (manufactured by Nippon Kayaku Co., Ltd.), Viscoat 192, 220, 2311HP, 2000, 2100, 2150, 8F, 17F (manufactured by Osaka Organic Chemical Industry Co., Ltd.), and the like can be given.

Examples of the polyfunctional monomers having two or more ethylenically unsaturated bonds in one molecule include ethylene glycol di(meth)acrylate, dicyclopentenyl di(meth)acrylate, triethylene glycol diacrylate, tetraethylene glycol di(meth)acrylate, tricyclodecanediyldimethylene di(meth)acrylate, tris(2-hydroxyethyl)isocyanurate di(meth)acrylate, tris(2-hydroxyethyl)isocyanurate tri(meth)acrylate, caprolactone-modified tris(2-hydroxyethyl)isocyanurate tri(meth)acrylate, trimethylolpropane tri(meth)acrylate, EO-modified trimethylolpropane tri(meth)acrylate, PO-modified trimethylolpropane tri(meth)acrylate, tripropylene glycol di(meth)acrylate, neopentyl glycol di(meth)acrylate, both terminal (meth)acrylate adduct of bisphenol A diglycidyl ether, 1,4-butanediol di(meth)acrylate, 1,6-hexanediol di(meth)acrylate, pentaerythritol tri(meth)acrylate, pentaerythritol tetra(meth)acrylate, polyester di(meth)acrylate, polyethylene glycol di(meth)acrylate, dipentaerythritol hexa(meth)acrylate, dipentaerythritol penta(meth)acrylate, dipentaerythritol tetra(meth)acrylate, caprolactone-modified dipentaerythritol hexa(meth)acrylate, caprolactone-modified dipentaerythritol penta(meth)acrylate, ditrimethylolpropane tetra(meth)acrylate, EO-modified bisphenol A di(meth)acrylate, PO-modified bisphenol A di(meth)acrylate, EO-modified hydrogenated bisphenol A di(meth)acrylate, PO-modified hydrogenated bisphenol A di(meth)acrylate, EO-modified bisphenol F di(meth)acrylate, (meth)acrylate of phenol novolak polyglycidyl ether, and the like. These compounds can be used either individually or in combination of two or more.

As examples of commercially available products of these polyfunctional monomers, SA 1002 (manufactured by Mitsubishi Chemical Corp.), Viscoat 195, 230, 260, 215, 310, 214HP, 295, 300, 360, GPT, 400, 700, 540, 3000, 3700 (manufactured by Osaka Organic Chemical Industry Co., Ltd.), KAYARAD R-526, HDDA, NPGDA, TPGDA, MANDA, R-551, R-712, R-604, R-684, PET-30, GPO-303, TMPTA, THE-330, DPHA, DPHA-2H, DPHA-2C, DPHA-21, D-310, D-330, DPCA-20, DPCA-30, DPCA-60, DPCA-120, DN-0075, DN-2475, T-1420, T-2020, T-2040, TPA-320, TPA-330, RP-1040, RP-2040, R-011, R-300, R-205 (manufactured by Nippon Kayaku (Co., Ltd.), ARONIX M-210, M-220, M-233, M-240, M-215, M-305, M-309, M-310, M-315, M-325, M-400, M-6200, M-6400 (manufactured by Toagosei Co., Ltd.), Lite Acrylate BP-4EA, BP-4PA, BP-2EA, BP-2PA, DCP-A (manufactured by Kyoeisha Chemical Co., Ltd.), New Frontier BPE-4, TEICA, BR-42M, GX-8345 (manufactured by Daiichi Kogyo Seiyaku Co., Ltd.), ASF-400 (manufactured by Nippon Steel Chemical Co., Ltd.), Ripoxy SP-1506, SP-1507, SP-1509, VR-77, SP-4010, SP-4060 (manufactured by Showe Highpolymer Co., Ltd.), NK Eater A-BPE-4 (manufactured by Shin-Nakamura Chemical Co., Ltd.), and the like can be given.

These polyfunctional monomers having three or more ethylenically unsaturated bonds can be selected from the group consisting of the above-mentioned tri(meth)acrylate compounds, tetra(meth)acrylate compounds, penta(meth)acrylate compounds, and hexa(meth)acrylate compounds. Of these, trimethylolpropane tri(meth)acrylate, EO-modified trimethylolpropane tri(meth)acrylate, dipentaerythritol hexa (meth)acrylate, dipentaerythritol penta(meth)acrylate, and ditrimethylolpropane tetra(meth)acrylate are particularly preferable. These compounds can be used either individually or in combination of two or more.

Epoxides

The epoxide-containing materials, also referred to as epoxy materials, can be cationically curable. This means that polymerization and/or crosslinking and other reactions of the epoxy group can be initiated by cations. These materials may be monomers, oligomers or polymers and are sometimes referred to as "compositions." Such materials may have an aliphatic, aromatic, cycloaliphatic, arylaliphatic or heterocyclic structure; they can comprise epoxide groups as side groups or groups that form part of an alicyclic or heterocyclic ring system. Epoxy compositions of those types include those that are generally known and are commercially available.

The composition may contain one or more epoxies. Preferably, the composition will comprise at least one liquid (at room temperature, 23° C.) component such that the combination of materials is a liquid. Thus, the epoxide-containing material is preferably a single liquid epoxy material, a combination of liquid epoxy materials, or a combination of liquid epoxy material(s) and solid epoxy material(s) which is soluble in the liquid. However, in certain embodiments, e.g. in embodiments where the epoxide material is soluble in other components of the composition, the epoxy material may be comprised only of materials that are solid at room temperature. When solid compositions are used, the compositions may be thinned or liquefied by applying shear and/or heat prior to or during use.

Examples of suitable epoxy materials include polyglycidyl and poly(methylglycidyl) esters of polycarboxylic acids, or poly(oxiranyl)ethers of polyethers. The polycarboxylic acid can be aliphatic, such as, for example, glutaric acid, adipic acid and the like; cycloaliphatic, such as, for example, tetrahydrophthalic acid; or aromatic, such as, for example, phthalic acid, isophthalic acid, trimellitic acid, or pyromellitic acid. The polyether can be poly(tetramethylene oxide). These compounds can be used either individually or in combination of two or more.

Other suitable epoxy materials also include polyglycidyl or poly(-methylglycidyl)ethers obtainable by the reaction of a compound having at least one free alcoholic hydroxy group and/or phenolic hydroxy group and a suitably substituted epichlorohydrin. The alcohols can be acyclic alcohols, such as, for example, ethylene glycol, diethylene glycol, and higher poly(oxyethylene) glycols; cycloaliphatic, such as, for example, 1,3- or 1,4-dihydroxycyclohexane, bis(4-hydroxycyclohexyl)methane, 2,2-bis(4-hydroxycyclohexyl)propane, or 1,1-bis(hydroxymethyl)cyclohex-3-ene; or contain aromatic nuclei, such as N,N-bis(2-hydroxyethyl)aniline or p,p'-bis(2-hydroxyethylamino)diphenylmethane. These compounds can be used either individually or in combination of two or more.

Other suitable epoxy compounds include those which may be derived from mono nuclear phenols, such as, for example, resorcinol or hydroquinone, or they may be based on polynuclear phenols, such as, for example, bis(4-hydroxyphenyl) methane (bisphenol F), 2,2-bis(4-hydroxyphenyl)propane (bisphenol A), or on condensation products, obtained under acidic conditions, of phenols or cresols with formaldehyde, such as phenol novolacs and cresol novolacs. These compounds can be used either individually or in combination of two or more.

Suitable epoxy materials also include poly(N-glycidyl) compounds, which are, for example, obtainable by dehydrochlorination of the reaction products of epichlorohydrin with amines that comprise at least two amine hydrogen atoms, such as, for example, n-butylamine, aniline, toluidine, m-xylylene diamine, bis(4-aminophenyl)methane or bis(4-methylaminophenyl)methane. Suitable poly(N-glycidyl) compounds also include N,N'-diglycidyl derivatives of cycloalkyleneureas, such as ethyleneurea or 1,3-propyleneurea, and N,N'-diglycidyl derivatives of hydantoins, such as 5,5-dimethylhydantoin. These compounds can be used either individually or in combination of two or more.

Examples of suitable epoxy materials include poly(S-glycidyl) compounds which are di-S-glycidyl derivatives which are derived from dithiols such as, for example, ethane-1,2-dithiol or bis(4-mercaptomethylphenyl)ether.

Epoxide-containing materials can be selected from the group consisting of bis(2,3-epoxycyclopentyl)ether, 2,3-epoxy cyclopentyl glycidyl ether. 1,2-bis(2,3-epoxycyclopentyloxy)ethane, bis(4-hydroxycyclohexyl)methane diglycidyl ether, 2,2-bis(4-hydroxycyclohexyl)propane diglycidyl ether, 3,4-epoxycyclohexylmethyl-3,4-epoxycyclohexane, 3,4-epoxy-6-methylcyclohexylmethyl-3,4-epoxy-6-methylcyclohexanecarboxylate, di(3,4-epoxycyclohexylmethyl)hexanedioate, di(3,4-epoxy-6-methylcyclohexylmethyl)hexanedioate, ethylenebis(3,4-epoxycyclohexanecarboxylate), ethanedioldi(3,4-epoxycyclohexylmethyl)ether, vinylcyclohexene dioxide, dicyclopentadiene, diepoxide, .alpha.-(oxiranylmethyl)-.omega.-(oxiranylmethoxy) poly(oxy-1,4-butanediyl), diglycidyl ether of neopentyl glycol, or 2-(3,4-epoxycyclohexyl-5,5-spiro-3,4-epoxy)cyclohexane-1,3-dioxane, and combinations thereof. These compounds can be used either individually or in combination of two or more.

It is, however, also possible to use epoxies in which the 1,2-epoxy groups are bonded to different heteroatoms or functional groups. Those compounds include, for example, the N,N,O-triglycidyl derivative of 4-aminophenol, the glycidyl ether glycidyl ester of salicylic acid, N-glycidyl-N'-(2-glycidyloxypropyl)-5,5-dimethylhydantoin, or 2-glycidyloxy-1,3-bis(5,5-dimethyl-1-glycidylhydantoin-3-yl) propane. In addition, liquid pre-reacted adducts of such epoxies with hardeners are suitable for epoxies.

Additional epoxy materials include cycloaliphatic diepoxides such as bis(4-hydroxycyclohexyl)methane diglycidyl ether, 2,2-bis(4-hydroxycyclohexyl)propane diglycidyl ether, 3,4-epoxycyclohexylmethyl-3,4-epoxycyclohexanecarboxylate, 3,4-epoxy-6-methylcyclohexylmethyl-3,4-epoxy-6-methylcyclohexanecarboxylate, di(3,4-epoxycyclohexylmethyl)hexanedioate, di(3,4-epoxy-6-methylcyclohexylmethyl)hexanedioate, ethylenebis(3,4-epoxycyclohexanecarboxylate), ethanedioldi(3,4-epoxycyclohexylmethyl)ether, 2-(3,4-epoxycyclohexyl-5,5-spiro-3,4-epoxy)cyclohexane-1,3-dioxane, and combinations thereof. These compounds can be used either individually or in combination of two or more.

Other epoxy compounds comprise at least one cyclohexeneoxide structure, more preferably at least 2 cyclohexeneoxide structures.

The epoxy materials can have molecular weights which vary over a wide range. In general, the epoxy equivalent weight, i.e., the number average molecular weight divided by the number of reactive epoxy groups, is preferably in the range of 60 to 1000.

Hydroxyl Containing Monomers

The present compositions may comprise suitable non-free radical polymerizable hydroxy-functional compounds.

The hydroxyl-containing material which can be used in the present invention may be any suitable organic material having a hydroxyl functionality of at least 1, and preferably at least 2. The material is preferably substantially free of any groups which interfere with the curing reactions or which are thermally or photolytically unstable. These compounds can be used either individually or in combination of two or more.

Any hydroxy group may be employed for the particular purpose. Preferably the hydroxyl-containing material contains two or more primary or secondary aliphatic hydroxyl. The hydroxyl group may be internal in the molecule or terminal. Monomers, oligomers or polymers can be used. The hydroxyl equivalent weight, i.e., the number average molecular weight divided by the number of hydroxyl groups, is preferably in the range of 31 to 5000. These compounds can be are used either individually or in combination of two or more.

Representative examples of hydroxyl-containing materials having a hydroxyl functionality of 1 include alkanols, monoalkyl ethers of polyoxyalkyleneglycols, monoalkyl ethers of alkyleneglycols, and others, and combinations thereof.

Representative examples of useful monomeric polyhydroxy organic materials include alkylene and arylalkylene glycols and polyols, such as 1,2,4-butanetriol, 1,2,6-hexanetriol, 1,2,3-heptanetriol, 2,6-dimethyl-1,2,6-hexanetriol, (2R,3R)-(−)-2-benzyloxy-1,3,4-butanetriol, 1,2,3-hexanetriol, 1,2,3-butanetriol, 3-methyl-1,3,5-pentanetriol, 1,2,3-cyclohexanetriol, 1,3,5-cyclohexanetriol, 3,7,11,15-tetramethyl-1,2,3-hexadecanetriol, 2-hydroxymethyltetrahydropyran-3,4,5-triol, 2,2,4,4-tetramethyl-1,3-cyclobutanediol, 1,3-cyclopentanediol, trans-1,2-cyclooctanediol, 1,16-hexadecanediol, 3,6-dithia-1,8-octanediol, 2-butyne-1,4-diol, 1,3-propanediol, 1,4-butanediol, 1,5-pentanediol, 1,6-hexanediol, 1,7-heptanediol, 1,8-octanediol, 1,9-nonanediol, 1-phenyl-1,2-ethanediol, 1,2-cyclohexanediol, 1,5-decalindiol, 2,5-dimethyl-3-hexyne-2,5-diol, 2,7-dimethyl-3,5-octadiyne-2-7-diol, 2,3-butanediol, 1,4-cyclohexanedimethanol, and combinations thereof.

Representative examples of useful oligomeric and polymeric hydroxyl-containing materials include polyoxyethylene and polyoxypropylene glycols and triols of molecular weights from about 200 to about 10,000; polytetramethylene glycols of varying molecular weight; poly(oxyethylene-oxybutylene) random or block copolymers; copolymers containing pendant hydroxy groups formed by hydrolysis or partial hydrolysis of vinyl acetate copolymers, polyvinylacetals containing pendant hydroxyl groups; hydroxy-terminated polyesters and hydroxy-terminated polylactones; hydroxy-functionalized polyalkadienes, such as polybutadiene; aliphatic polycarbonate polyols, such as an aliphatic polycarbonate diol; and hydroxy-terminated polyethers, and combinations thereof.

Other hydroxyl-containing monomers include 1,4-cyclohexanedimethanol and aliphatic and cycloaliphatic monohydroxy alkanols. Other hydroxyl-containing oligomers and polymers include hydroxyl and hydroxyl/epoxy functionalized polybutadiene, polycaprolactone diols and triols, ethylene/butylene polyols, and monohydroxyl functional monomers. Examples of polyether polyols are polypropylene glycols of various molecular weights and glycerol propoxylate-B-ethoxylate triol. Additional examples include linear and branched polytetrahydrofuran polyether polyols available in various molecular weights, such as in the range of 150-4000 g/mol, preferably in the range of 150-1500 g/mol, more preferably in the range of 150-750 g/mol.

If present, the composition preferably comprises, relative to the total weight of the composition, at least 1 wt % of one or more non-free radical polymerizable hydroxy-functional compounds, more preferably at least 5 wt %, and most preferably at least 10 wt %. Furthermore, the composition preferably comprises, relative to the total weight of the composition, at most 60 wt % of one or more non-free radical polymerizable hydroxy-functional compounds, more preferably at most 40 wt %, and most preferably at most 25 wt %.

Oxetanes

The following compounds are examples of oxetane compounds having one oxetane ring in the molecule, 3-ethyl-3-hydroxymethyloxetane, 3-(meth)allyloxymethyl-3-ethyloxetane, (3-ethyl-3-oxetanylmethoxy)methylbenzen, 4-fluoro-[1-(3-ethyl-3-oxetanylmethoxy)methyl]benzene, 4-methoxy-[1-(3-ethyl-3-oxetanylmethoxy)methyl]benzene, [1-(3-ethyl-3-oxetanylmethoxy)ethyl]phenyl ether, isobutoxymethyl(3-ethyl-3-oxetanylmethyl)ether, isobornyloxyethyl(3-ethyl-3-oxetanylmethyl)ether, isobornyl(3 ethyl 3 oxetanylmethyl)ether, 2-ethylhexyl(3-ethyl-3-oxetanylmethyl)ether, ethyldiethylene glycol(3-ethyl-3-oxetanylmethyl)ether, dicyclopentadiene(3-ethyl-3-oxetanylmethyl)ether, dicyclopentenyloxyethyl(3-ethyl-3-oxetanyl methyl)ether, dicyclopentenyl(3-ethyl-3-oxetanylmethyl)ether, tetrahydrofurfuryl(3-ethyl-3-oxetanylmethyl)ether, tetrabromophenyl(3-ethyl-3-oxetanylmethyl)ether, 2-tetrabromophenoxyethyl(3-ethyl-3-oxetanylmethyl)ether, tribromophenyl(3-ethyl-3-oxetanylmethyl)ether, 2-tribromophenoxyethyl(3-ethyl-3-oxetanylmethyl)ether, 2-hydroxyethyl(3-ethyl-3-oxetanyl methyl)ether, 2-hydroxypropyl(3 ethyl 3 oxetanylmethyl)ether, butoxyethyl(3-ethyl-3-oxetanylmethyl)ether, pentachlorophenyl(3-ethyl-3-oxetanylmethyl)ether, pentabromophenyl(3-ethyl-3-oxetanylmethyl)ether, bornyl(3-ethyl-3-oxetanylmethyl)ether, and the like. These compounds can be used either individually or in combination of two or more.

Examples of compounds having two or more oxetane rings in the molecule are 3,7-bis(3-oxetanyl)-5-oxa-nonane, 3,3'-(1,3-(2-methylenyl)propanediylbis(oxymethylene))bis-(3-ethyloxetane), 1,4-bis[(3-ethyl-3-oxetanylmethoxy)methyl]benzene, 1,2-bis[(3-ethyl-3-oxetanylmethoxy)methyl]ethane, 1,3-bis[(3-ethyl-3-oxetanylmethoxy)methy]propane, ethylene glycol bis(3-ethyl-3-oxetanylmethyl)ether, dicyclopentenyl bis(3-ethyl-3oxetanylmethyl)ether, triethylene glycol bis(3-ethyl-3oxetanylmethyl)ether, tetraethylene glycol bis(3-ethyl-3-oxetanylmethyl)ether, tricyclodecanediyldimethylene(3-ethyl-3-oxetanylmethyl)ether, trimethylolpropane tris(3-ethyl-3-oxetanylmethyl)ether, 1,4-bis(3-ethyl-3-oxetanylmethoxy)butane, 1,6-bis(3 ethyl 3 oxetanylmethoxy)hexane, pentaerythritol tris(3-ethyl-3-oxetanylmethyl)ether, pentaerythritol tetrakis(3-ethyl-3-oxetanylmethyl)ether, polyethylene glycol bis(3-ethyl-3-oxetanylmethyl)ether, dipentaerythritol hexakis(3-ethyl-3-oxetanylmethyl)ether, dipentaerythritol pentakis(3-ethyl-3-oxetanylmethyl)ether, dipentaerythritol tetrakis(3-ethyl-3-oxetanylmethyl)ether, caprolactone-modified dipentaerythritol hexakis(3-ethyl-3-oxetanylmethyl)ether, caprolactone-modified dipentaerythritol pentakis(3-ethyl-3-oxetanylmethyl)ether, ditrimethylolpropane tetrakis(3-ethyl-3-oxetanylmethyl)ether, EO-modified bisphenol A bis(3-ethyl-3-oxetanylmethyl)ether, PO-modified bisphenol A bis (3-ethyl-3-oxetanylmethyl)ether, EO-modified hydrogenated bisphenol A bis(3-ethyl-3-oxetanylmethyl) ether, PO-modified hydrogenated bisphenol A bis(3-ethyl-3-oxetanylmethyl)ether, EO-modified bisphenol F (3-ethyl-3-oxetanylmethyl)ether, and the like. These compounds can be used either individually or in combination of two or more Of the above compounds, oxetane compounds having 1-10, preferably 1-4, and particularly preferably two oxetane rings in the molecule are suitable. Specifically, (3-ethyl-3-oxetanylmethoxy)methylbenzene, 1,4-bis[(3-ethyl-3-oxetanylmethoxy)methyl]benzene, 1,2-bis(3-ethyl-3-oxetanylmethoxy)ethane and trimethylolpropane tris(3-ethyl-3-oxetanylmethyl)ether are used. These compounds can be used either individually or in combination of two or more.

Cationic Photoinitiators

In the compositions according to the invention, any suitable type of photoinitiator that, upon exposure to actinic radiation, forms cations that initiate the reactions of the cationically polymerizable compounds, such as epoxy material(s), can be used. There are a large number of known and technically proven cationic photoinitiators that are suitable. They include, for example, onium salts with anions of weak nucleophilicity. Examples are halonium salts, iodosyl salts or sulfonium salts, such as are described in published European patent application EP 153904 and WO 98/28663, sulfoxonium salts, such as described, for example, in published European patent applications EP 35969, 44274, 54509, and 164314, or diazonium salts, such as described, for example, in U.S. Pat. Nos. 3,708,296 and 5,002,856. All eight of these disclosures are hereby incorporated in their entirety by reference. Other cationic photoinitiators are metallocene salts, such as described, for example, in published European applications EP 94914 and 94915, which applications are both hereby incorporated in their entirety by reference.

A survey of other current onium salt initiators and/or metallocene salts can be found in "UV Curing. Science and Technology" (Editor S. P. Pappas, Technology Marketing Corp., 642 Westover Road, Stamford, Conn., U.S.A.) or "Chemistry & Technology of UV & EB Formulation for Coatings, Inks & Paints (Volume 3)" (edited by P. K. T. Oldring), and both books are hereby incorporated in their entirety by reference.

Other cationic photoinitiators include iodonium photoinitiators, e.g. iodonium tetrakis(pentafluorophenyl) borate, because they tend to be less yellowing, especially when used in combination with photosensitizers.

In order to increase the light efficiency, or to sensitize the cationic photoinitiator to specific wavelengths, such as for example specific laser wavelengths or a specific series of laser wavelengths, it is also possible, depending on the type of initiator, to use sensitizers. Examples are polycyclic aromatic hydrocarbons or aromatic keto compounds. Specific examples of preferred sensitizers are mentioned in published European patent application EP 153904. Other preferred sensitizers are benzoperylene, 1,8-diphenyl-1,3,5,7-octatetraene, and 1,6-diphenyl-1,3,5-hexatriene as described in U.S. Pat. No. 5,667,937, which is hereby incorporated in its entirety by reference. It will be recognized that an additional factor in the choice of sensitizer is the nature and primary wavelength of the source of actinic radiation.

A present stereolithography composition can comprise, relative to the total weight of the composition, 0.1-15 wt % of one or more cationic photoinitiators, more preferably 1-10 wt %.

Free Radical Photoinitiators

The compositions may employ a photoinitiator that forms free radicals when the appropriate irradiation takes place can be used. Typical compounds of known photoinitiators are benzoins, such as benzoin, benzoin ethers, such as benzoin methyl ether, benzoin ethyl ether, and benzoin isopropyl ether, benzoin phenyl ether, and benzoin acetate, acetophenones, such as acetophenone, 2,2-dimethoxyacetophenone, 4-(phenylthio)acetophenone, and 1,1-dichloroacetophenone, benzil, benzil ketals, such as benzil dimethyl ketal, and benzyl diethyl ketal, anthraquinones, such as 2-methylanthraquinone, 2-ethylanthraquinone, 2-tertbutylanthraquinone, 1-chloroanthraquinone, and 2-amylanthraquinone, also triphenylphosphine, benzoylphosphine oxides, such as, for example, 2,4,6-trimethylbenzoyldiphenylphosphine oxide (Lucirin TPO), benzophenones, such as benzophenone, and 4,4'-bis(N,N'-dimethylamino)benzophenone, thioxanthones and xanthones, acridine derivatives, phenazene derivatives, quinoxaline derivatives or 1-phenyl-1,2-propanedione-2-O-benzoyloxime, 1-aminophenyl ketones or 1-hydroxyphenyl ketones, such as 1-hydroxycyclohexyl phenyl ketone, phenyl (1-hydroxyisopropyl)ketone and 4-isopropylphenyl(1-hydroxyisopropyl)ketone, or triazine compounds, for example, 4'''-methyl thiophenyl-1-di(trichloromethyl)-3,5-S-triazine, S-triazine-2-(stilbene)-4,6-bistrichloromethyl, and paramethoxy styryl triazine, all of which are known compounds. These compounds can be used either individually or in combination of two or more.

Other suitable free-radical photoinitiators, which are normally used in combination with a He/Cd laser, operating at for example 325 nm, an Argon-ion laser, operating at for example 351 nm, or 351 and 364 nm, or 333, 351, and 364 nm, or a frequency tripled YAG solid state laser, having an output of 349 or 355 nm, as the radiation source, are acetophenones, such as 2,2-dialkoxybenzophenones and 1-hydroxyphenyl ketones, for example 1-hydroxycyclohexyl phenyl ketone, 2-hydroxy-1-{4-(2-hydroxyethoxy)phenyl}-2-methyl-1-propanone, or 2-hydroxyisopropyl phenyl ketone (also called 2-hydroxy-2,2-dimethylacetophenone), but especially 1-hydroxycyclohexyl phenyl ketone. Another class of free-radical photoinitiators comprises the benzil ketals, such as, for example, benzil dimethyl ketal. Especially an alpha-hydroxyphenyl ketone, benzil dimethyl ketal, or 2,4,6-trimethylbenzoyldiphenylphosphine oxide may be used as photoinitiator. These compounds can be are used either individually or in combination of two or more.

Another class of suitable free radical photoinitiators comprises the ionic dye-counter ion compounds, which are capable of absorbing actinic rays and producing free radicals, which can initiate the polymerization of the acrylates. The compositions according to the invention that comprise ionic dye-counter ion compounds can thus be cured in a more variable manner using visible light in an adjustable wavelength range of 400 to 700 nanometers. Ionic dye-counter ion compounds and their mode of action are known, for example from published European patent application EP 223587 and U.S. Pat. Nos. 4,751,102, 4,772,530 and 4,772,541.

Other free radical photoinitiators include 1-hydroxycyclohexyl phenyl ketone, 2-hydroxy-2-methyl-1-phenylpropan-1-one, 2,2-dimethoxyacetophenone, and 2,4,6-trimethylbenzoyldiphenylphosphine oxide. These photoinitiators tend to be comparatively less yellowing.

The present composition can comprise, relative to the total weight of the composition, 0.1-15 wt % of one or more free radical photoinitiators, more preferably 1-10 wt %.

Additives

Additives may also be present in the composition of the invention. Stabilizers are often added to the compositions in order to prevent a viscosity build-up, for instance a viscosity build-up during usage in a solid imaging process. Preferred stabilizers include those described in U.S. Pat. No. 5,665,792, the entire disclosure of which is hereby incorporated by reference. Such stabilizers are usually hydrocarbon carboxylic acid salts of group IA and IIA metals. Most preferred examples of these salts are sodium bicarbonate, potassium bicarbonate, and rubidium carbonate. Rubidium carbonate is preferred for formulations of this invention with recommended amounts varying between 0.0015 to 0.005% by weight of composition. Alternative stabilizers are polyvinylpyrrolidones and polyacrylonitriles. Other possible additives include dyes, pigments, fillers (e.g % silica particles—preferably cylindrical or spherical silica particles—, glass beads, or talc), antioxidants, wetting agents, photosensitizers for the free-radical photoinitiator, leveling agents, surfactants and the like,

EXAMPLES

Examples 1-6

In each of examples 1-6, control compositions indicated in Table 1 were prepared to which fluorinated surfactants were later added in varying concentrations as indicated in Table 3. Approximately 20 g of control composition or control composition with added fluorinated surfactant was poured into a Falcon 351029 petri dish measuring 100 mm in diameter and 15 mm deep. The compositions were placed in a stereolithography imaging chamber and allowed to equilibrate the controlled 30° C. and 30% relative humidity of the chamber prior to exposure. In each Example, two images were scanned using an X-Y vector scan mirror set, one in the control solution and one in the control solution with added fluorinated surfactant. The imaging radiation was supplied using an Ar+ laser operating at a wavelength of 351 nm. The beam was focused to a nominal $1/e^2$ diameter of approximately 0.106 cm at the surface of the compositions. The scanning was accomplished using a Greyhawk scanner and the exposure was controlled via an acoustic-optic modulator to provide a substantially uniform exposure in the image region as taught in U.S. Pat. No. 5,014,207, which is hereby incorporated by reference in its entirety. While scanning the images, which were approximately 1 cm wide and 10 cm long, the beam was swept in the Y direction to draw a line 1 cm line across the width and incremented approximately 25.4 µm in the X direction to fill in the 10 cm length of the image. One strip was scanned in a control petri dish and one strip in an Example petri dish, one immediately following the other using the same exposure in each strip. Laser Exposure used was chosen based on the required exposure to achieve visible effects of distinguishable image retention and color formation. This varies for the compositions depending on the efficiency and amounts of initiator and the reactivity and image forming capability of other components in the individual composition. Table 2 details the exposures used in the Examples of Table 1.

In each of the examples and the controls, an acid indicating dye, Copikem XX (obtained from Hilton Davis Chemical Co.) was added. Prior to exposure, the compositions contained little or no acid and therefore had little or no color from the Copikem XX. Upon exposure, a photoacid and usually free radicals were formed within the image region. The photoacid reacted with the Copikem XX and produced a magenta color in the image region. The remainder of the composition was comprised of a photopolymer solution that polymerized to a solid or gel due to free-radical polymerization of a (meth)

acrylate and/or cationic polymerization of an epoxy, oxetane, and/or hydroxyl-containing material.

In the controls, there was evidence of diffusion of acid outside the image region. In most examples, this evidence was seen as a magenta color and typically included the magenta color with, perhaps, some thickening to gel formation of polymer. In some of the examples, Sartomer 9003 (SR-9003, Neopentyl glycol diacrylate) was in the formulation, in part, to help demonstrate the improved diffusional resolution. SR-9003, upon exposure, forms a soft gel image that has enough physical integrity that it retains image fidelity (the image does not immediately dissolve in the remaining composition), but still allows substantial diffusion of photoproducts from the image region. This high diffusion potential of the SR-9003 is particularly useful in that it exhibits the surprisingly powerful effect of the fluorinated surfactants for improving diffusional resolution by inhibiting the diffusion of the photoacid from the image region.

During scanning of the controls, the reaction products diffuse out from the image in a shape that closely resembles the bow wave of a ship, namely, the "bow wave" is close to the region just ahead of the scanning beam and then spreads to the sides of the image at a distance. In some cases, this wave of colored and slightly gelled material keeps some shape retention, but in other cases air currents, building vibrations, and other environmental effects begin to distort the shape of the wave. The diffusional wave has momentum and travels significantly ahead of and to the sides of the image region until it is either slowed by the confines of the dish or absorbed by the surrounding material.

In the presence of fluorinated surfactants, visual observation of this "bow wave" phenomenon is greatly reduced, or absent altogether. Each formulation with fluorinated surfactant was immediately compared by visual observation to the control that was formed immediately preceding it. The visual observations were quantified as scores of 1-3 for both layer formation and diffusional resolution. For layer formation, a score of 1 indicates that the layer formation was uneven with thick and thin sections within the image region and typically with thin sheet polymeric growth of attached polymer outside the image region. A score of 2 indicates that the layer formation within the image was generally uniform, though some striation related to scan spacing was evident and slight growth of attached polymer outside the image region was evident. And a score of 3 means that the layer formation within the image region was uniform without significant striation and there was no visible growth of attached polymer outside the image region. For diffusional resolution, a score of 1 indicates that there was evidence of a wake of diffused color or gel products separated from the image region. 2 means there was evidence of color formation adjacent to or just slightly separated from the image region and, in some cases, gel products were seen at the trailing edge of the image. 3 designates that there was no evidence of a wake of color formation or gel products surrounding the image, however, in some cases, there was color formation beneath the image usually adjacent to the bottom side of the image. The results for Examples 1-6 are presented in Table 4.

Table 3 indicates the results of a cure speed experiment using different concentrations of a fluorinated surfactant in two of the compositions from Examples 1-6. The cure speed was determined using a standard working curve procedure that is well known in the art. An example of this procedure is discussed with the results in Comparative Example A.

TABLE 1

Control Compositions (no Photoacid Diffusion Inhibitor)

| Component | Composition | | | | | |
|---|---|---|---|---|---|---|
| | 1 | 2 | 3 | 4 | 5 | 6 |
| UVR-6105 | 80% | 89.98% | | | 85.79% | |
| SR-9003 | | | 94.98% | 93.48% | 10% | 99.93% |
| Terathane 250 | | 5% | | | | |
| UVR-6000 | 19.20% | | | | | |
| CPI-1176 | | 5% | 5% | | 2.59% | |
| BMPS | | | | 1% | | |
| Triazine Y | | | | | | 0.05% |
| Rhodorsil 2074 | 0.50% | | | | | |
| IR-500 | | | | 5.50% | | |
| IR-184 | | | | | 1.60% | |
| Chivacure BMS | 0.28% | | | | | |
| Copikem XX | 0.02% | 0.02% | 0.02% | 0.02% | 0.02% | 0.02% |

TABLE 2

Exposure Parameters for Examples 1-6 and Controls

| Component | Composition | | | | | |
|---|---|---|---|---|---|---|
| | 1 | 2 | 3 | 4 | 5 | 6 |
| Laser Power mW | 106 | 108 | 107 | 107 | 106 | 112 |
| Scan Spacing (cm) | 0.00254 | 0.00254 | 0.00254 | 0.00254 | 0.00254 | 0.00254 |
| Exposure mJ/cm$^2$ | 99 | 124 | 170 | 170 | 168 | 668 |
| $D_p$ (cm) | 0.0138 | 0.0138 | 0.0138 | 0.0138 | 0.0138 | 0.0138 |

TABLE 3

Improvement of Cure Speed with Increased Photoacid Diffusion Inhibitor Concentration

| Wt % Polyfox 6520 | Cure Speed Example 1 | Cure Speed Example 5 |
|---|---|---|
| 0.0 | 171.3 mJ/cm$^2$ | 222.8 mJ/cm$^2$ |
| 0.001 | Not Done | 204.8 mJ/cm$^2$ |
| 0.005 | 117.5 mJ/cm$^2$ | 109.1 mJ/cm$^2$ |

TABLE 4

Improved Layer Formation and Diffusional Resolution Using Various Photoacid Diffusion Inhibitors

| Acid Diffusion Inhibitor Amount Added | Composition 1 Layer | 1 Diff. | 2 Layer | 2 Diff. | 3 Layer | 3 Diff. | 4 Layer | 4 Diff. | 5 Layer | 5 Diff. | 6 Layer | 6 Diff. |
|---|---|---|---|---|---|---|---|---|---|---|---|---|
| A—Control | 2 | 1 | 1 | 1 | 3 | 1 | 3 | 1 | 1 | 3 | 3 | 1 |
| B—Control w/ 1% Polyfox 636 | 2 | 3 | 3 | 2 | 3 | 3 | 3 | 3 | 3 | 3 | 2 | 3 |
| C—Control | 1 | 2 | 1 | 1 | 3 | 1 | 3 | 1 | 1 | 3 | 3 | 1 |
| D—Control w/ 0.2% Polyfox 636 | 2 | 3 | 2 | 2 | 3 | 3 | 3 | 2 | 2 | 3 | 3 | 3 |
| E—Control | 2 | 1 | 1 | 1 | ND | ND | 3 | 1 | 1 | 3 | 3 | 1 |
| F—Control w/ 0.001% Polyfox 656 | 2 | 3 | 2 | 3 | ND | ND | 3 | 1 | 2 | 3 | 3 | 1 |
| G—Control | 2 | 1 | 1 | 2 | 3 | 1 | 3 | 1 | 1 | 3 | 3 | 1 |
| H—Control w/ 0.1% Polyfox 656 | 2 | 3 | 2 | 3 | 3 | 3 | 3 | 2 | 3 | 3 | 3 | 3 |
| I—Control | 2 | 1 | 1 | 1 | 3 | 1 | 3 | 1 | 1 | 3 | 3 | 1 |
| J—Control w/ 0.001% FC 4430 | 2 | 3 | 2 | 1 | 3 | 1 | 3 | 1 | 1 | 3 | 3 | 1 |
| K—Control | 2 | 1 | 1 | 1 | 3 | 1 | 3 | 1 | 1 | 3 | 3 | 1 |
| L—Control w/ 0.1% FC 4430 | 2 | 3 | 2 | 2 | 3 | 1 | 3 | 2 | 2 | 3 | 3 | 2 |
| M—Control | 2 | 1 | 1 | 2 | 3 | 1 | 3 | 1 | 1 | 3 | 3 | 1 |
| N—Control w/ 0.01% Polyfox 6320 | 2 | 3 | 2 | 2 | 3 | 2 | 3 | 2 | 2 | 3 | 3 | 2 |
| O—Control | 2 | 2 | ND | ND | 3 | 1 | 3 | 1 | 1 | 3 | 3 | 1 |
| P—Control w/ 0.2% Polyfox 6320 | 2 | 3 | ND | ND | 3 | 3 | 3 | 2 | 2 | 3 | 3 | 3 |
| Q—Control | 2 | 1 | 1 | 1 | 3 | 1 | 3 | 1 | 1 | 3 | 3 | 1 |
| R—Control w/ 0.001% Polyfox 6520 | 3 | 3 | 1 | 2 | 3 | 3 | 3 | 3 | 3 | 3 | 3 | 3 |
| S—Control | 2 | 1 | 1 | 1 | 3 | 1 | 3 | 1 | 1 | 3 | 3 | 1 |
| T—Control w/ 0.005% Polyfox 6520 | 3 | 3 | 3 | 3 | 3 | 3 | 3 | 3 | 3 | 3 | 3 | 3 |

Figure 2A:
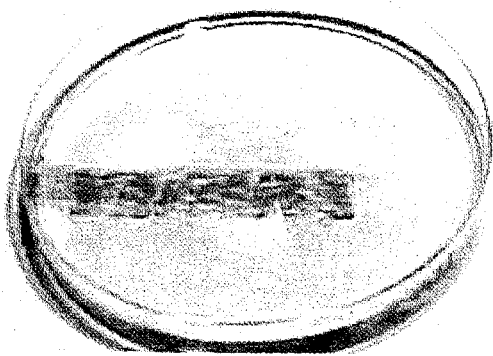
FIG. 2A-2B show an approximately 1 cm×10 cm cured strip of a composition formed from control composition 2 (A) and control composition 2 with 1% Polyfox 636 fluorinated surfactant (B) after cure.
Figure 2B:
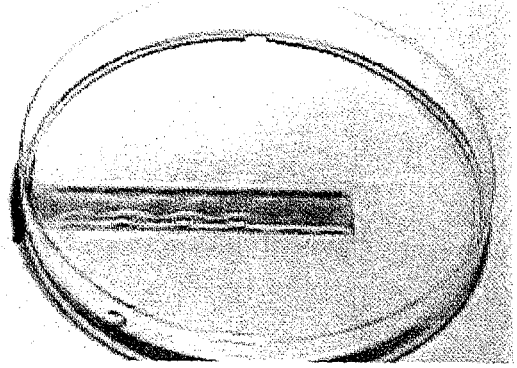
Figure 2C:
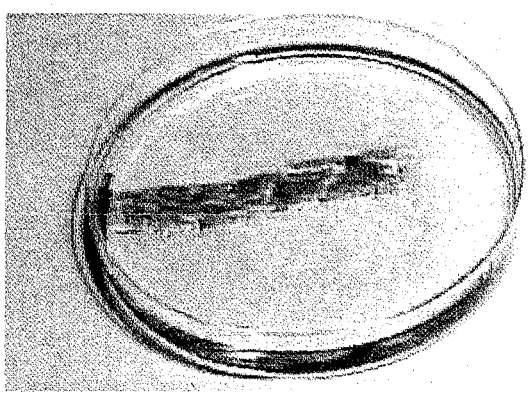
FIG. 2C-2D show an approximately 1 cm×10 cm cured strip of a composition formed from control composition 2 (C) and control composition 2 with 0.2% Polyfox 636 fluorinated surfactant (D) after cure.
Figure 2D:
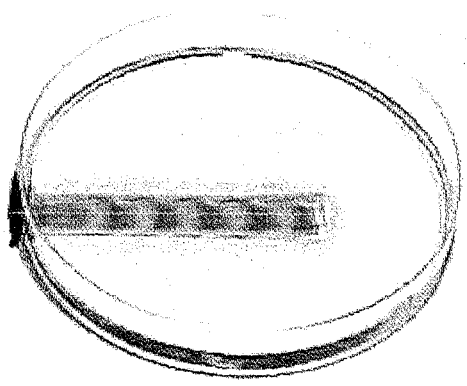
Figure 2I:
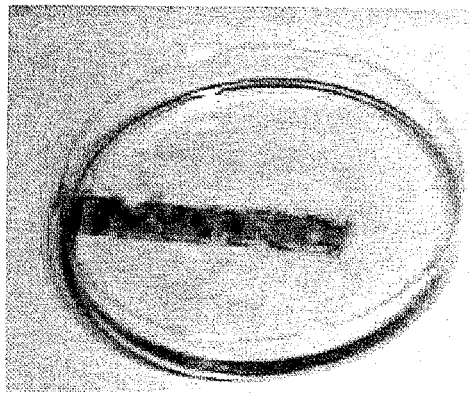
FIG. 2I-2J show an approximately 1 cm×10 cm cured strip of a composition formed from control composition 2 (I) and control composition 2 with 0.001% FC 4430 fluorinated surfactant (J) after cure.
Figure 2J:
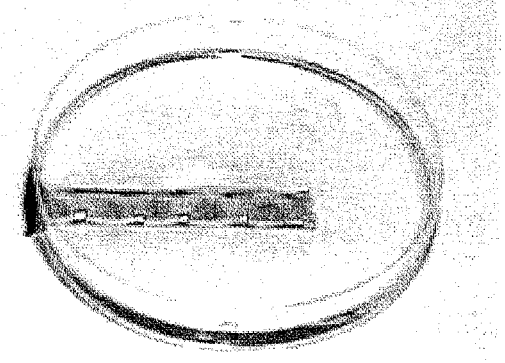
Figure 2K:
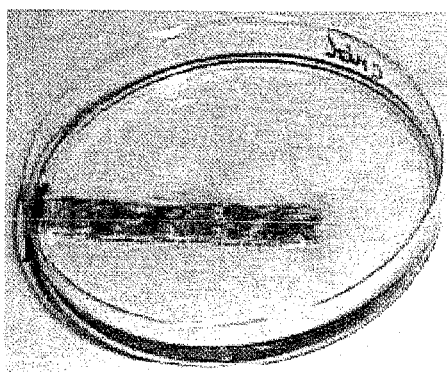
FIG. 2K-2L show an approximately 1 cm×10 cm cured strip of a composition formed from control composition 2 (K) and control composition 2 with 0.1% FC 4430 fluorinated surfactant (L) after cure.
Figure 2L:
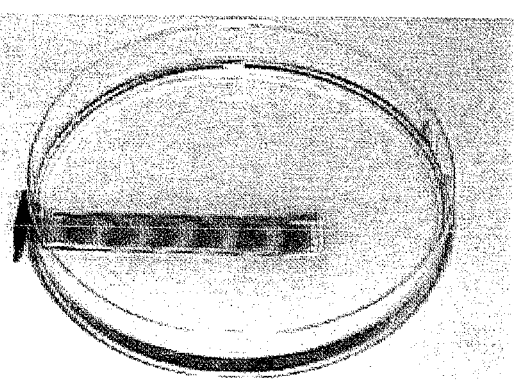
Figure 2M:
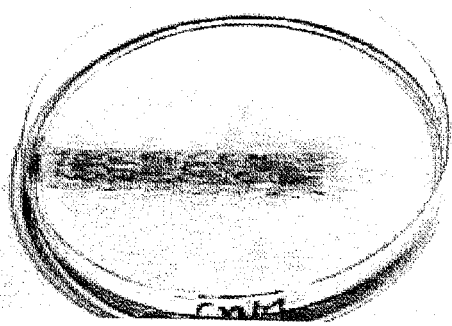
FIG. 2M-2N show an approximately 1 cm×10 cm cured strip of a composition formed from control composition 2 (M) and control composition 2 with 0.01% Polyfox 6320 fluorinated surfactant (N) after cure.
Figure 2N:
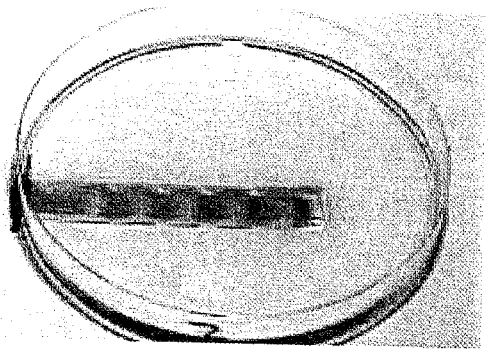
Figure 2Q:
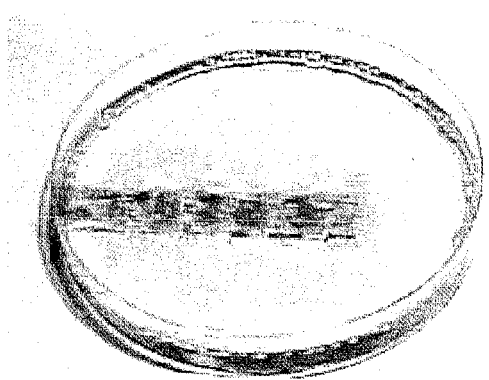
FIG. 2Q-2R show an approximately 1 cm×10 cm cured strip of a composition formed from control composition 2 (Q) and control composition 2 with 0.001% Polyfox 6520 fluorinated surfactant (R) after cure.
Figure 2R:
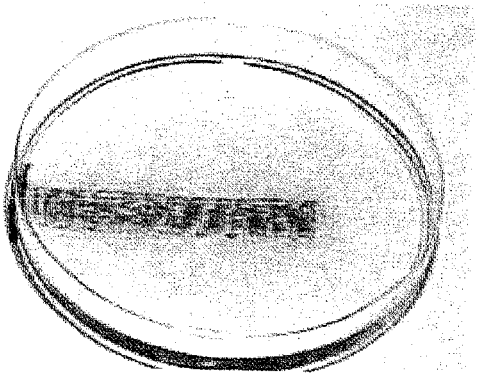
Figure 2S:
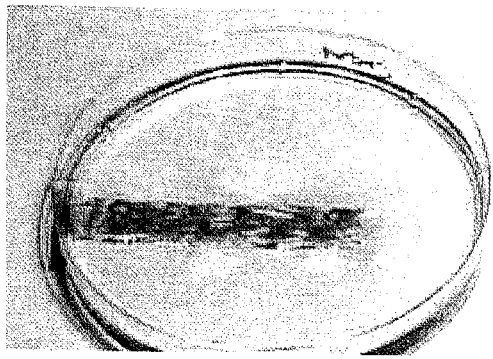
FIG. 2S-2T show an approximately 1 cm×10 cm cured strip of a composition formed from control composition 2 (S) and control composition 2 with 0.005% Polyfox 6520 fluorinated surfactant (T) after cure.
Figure 2T:
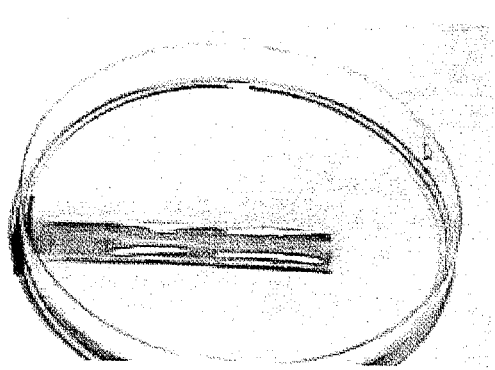
Figure 3A:
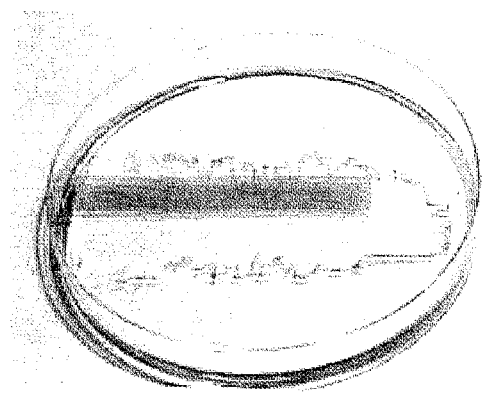
FIG. 3A-3B show an approximately 1 cm×10 cm cured strip of a composition formed from control composition 3 (A) and control composition 3 with 1% Polyfox 636 fluorinated surfactant (B) after cure.
Figure 3B:
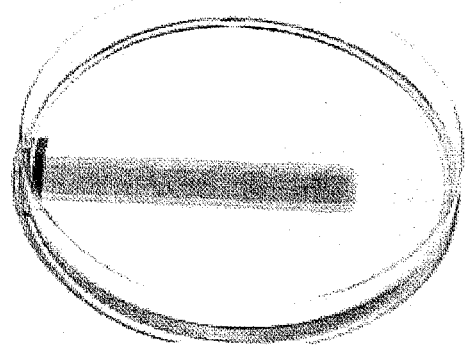
Figure 3C:
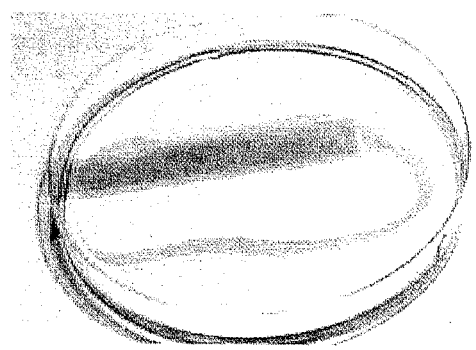
FIG. 3C-3D show an approximately 1 cm×10 cm cured strip of a composition formed from control composition 3 (C) and control composition 3 with 0.2% Polyfox 636 fluorinated surfactant (D) after cure.
Figure 3D:
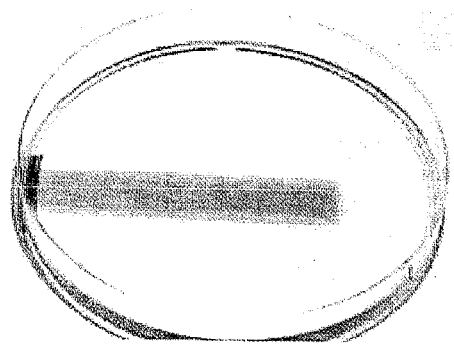
Figure 3G:
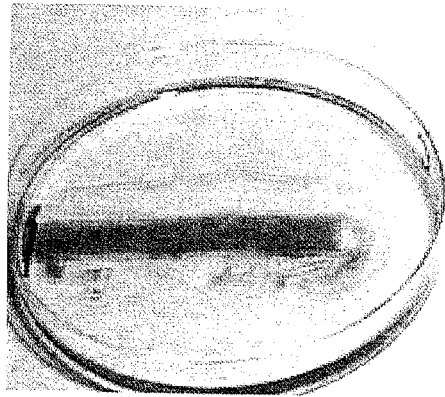
FIG. 3G-3H show an approximately 1 cm×10 cm cured strip of a composition formed from control composition 3 (G) and control composition 3 with 0.1% Polyfox 656 fluorinated surfactant (H) after cure.
Figure 3H:
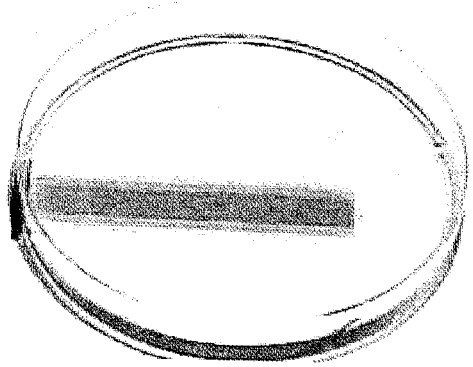
Figure 3I:
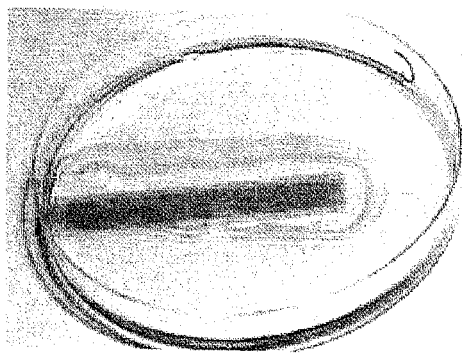
FIG. 3I-3J show an approximately 1 cm×10 cm cured strip of a composition formed from control composition 3 (I) and control composition 3 with 0.001% FC 4430 fluorinated surfactant (J) after cure.
Figure 3J:
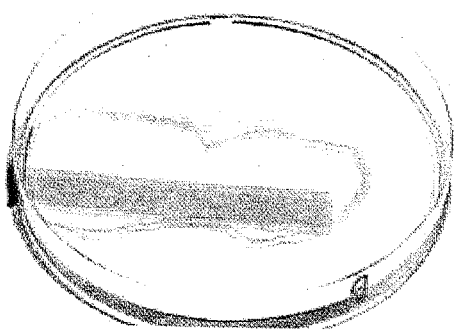
Figure 3K:
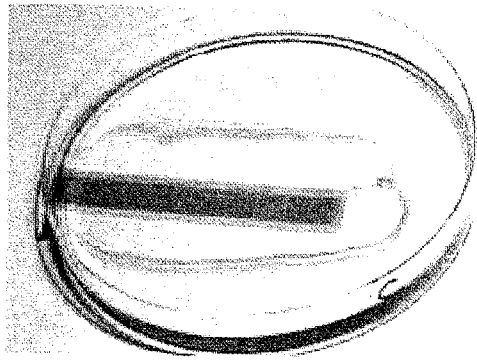
FIG. 3K-3L show an approximately 1 cm×10 cm cured strip of a composition formed from control composition 3 (K) and control composition 3 with 0.1% FC 4430 fluorinated surfactant (L) after cure.
Figure 3L:
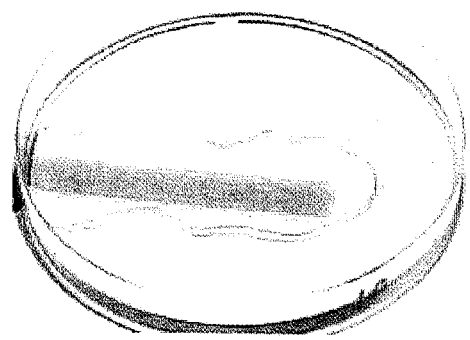
Figure 3M:
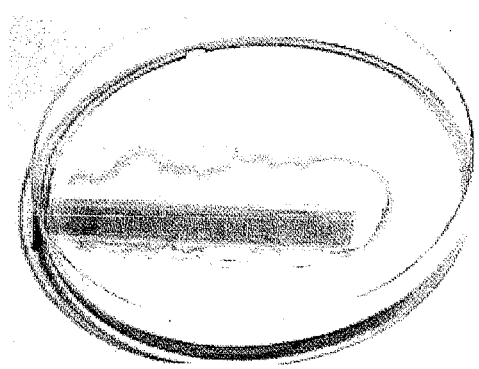
FIG. 3M-3N show an approximately 1 cm×10 cm cured strip of a composition formed from control composition 3 (M) and control composition 3 with 0.01% Polyfox 6320 fluorinated surfactant (N) after cure.
Figure 3N:
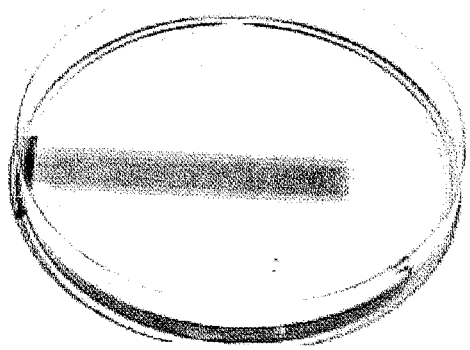
Figure 3O:
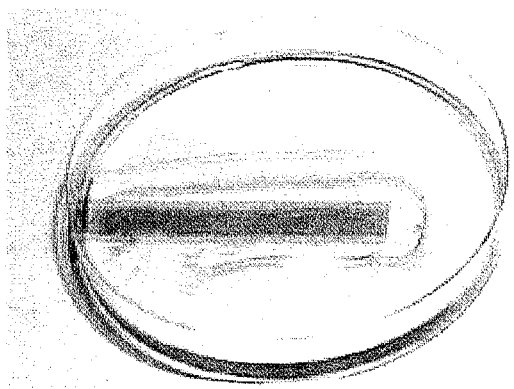
FIG. 3O-3P show an approximately 1 cm×10 cm cured strip of a composition formed from control composition 3 (O) and control composition 3 with 0.2% Polyfox 6320 fluorinated surfactant (P) after cure.
Figure 3P:
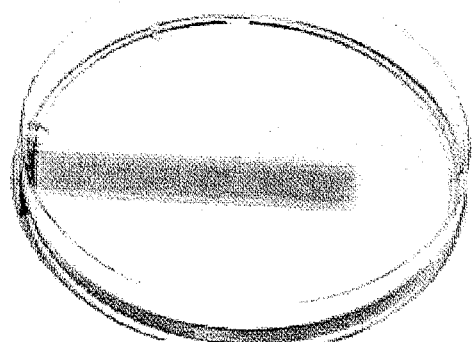
Figure 3Q:
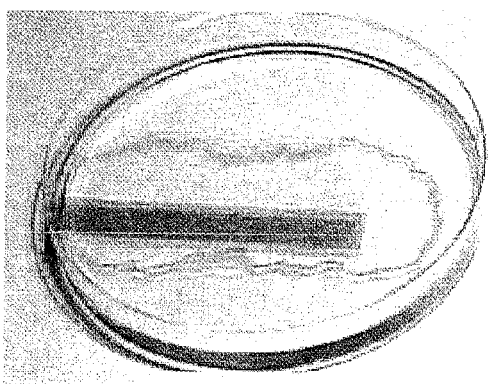
FIG. 3Q-3R show an approximately 1 cm×10 cm cured strip of a composition formed from control composition 3 (Q) and control composition 3 with 0.001% Polyfox 6520 fluorinated surfactant (R) after cure.
Figure 3R:
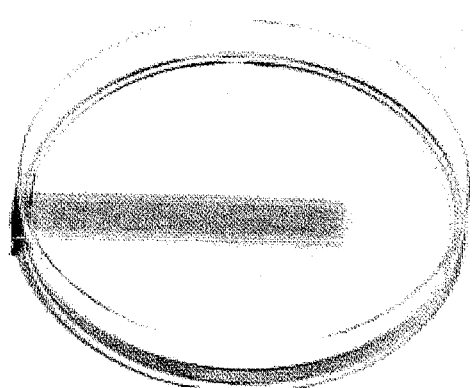
Figure 3S:
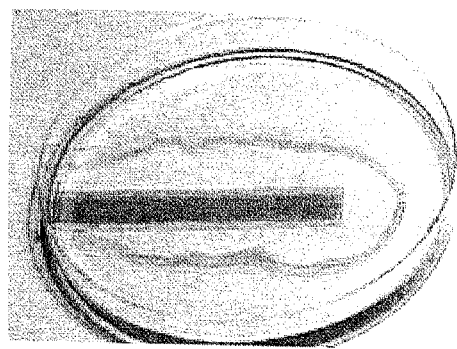
FIG. 3S-3T show an approximately 1 cm×10 cm cured strip of a composition formed from control composition 3 (S) and control composition 3 with 0.005% Polyfox 6520 fluorinated surfactant (T) after cure.
Figure 3T:
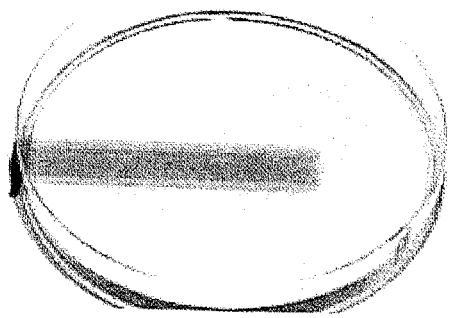
Figures 4A, 4B:
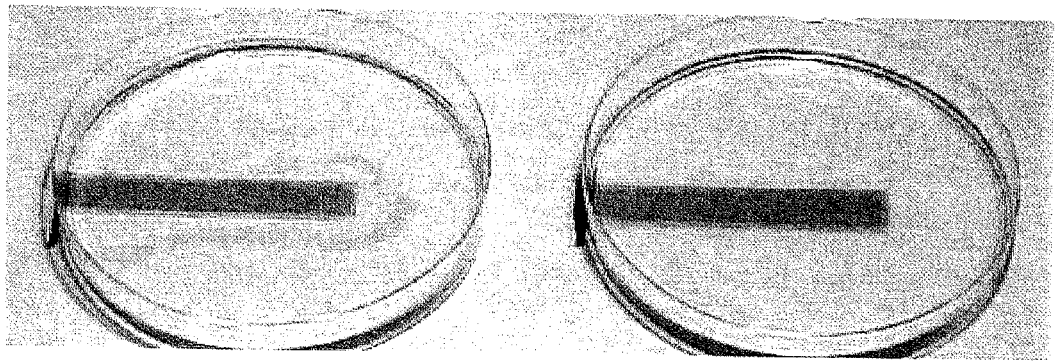
FIG. 4A-4B show an approximately 1 cm×10 cm cured strip of a composition formed from control composition 4 (A) and control composition 4 with 1% Polyfox 636 fluorinated surfactant (B) after cure.
Figures 4C, 4D:
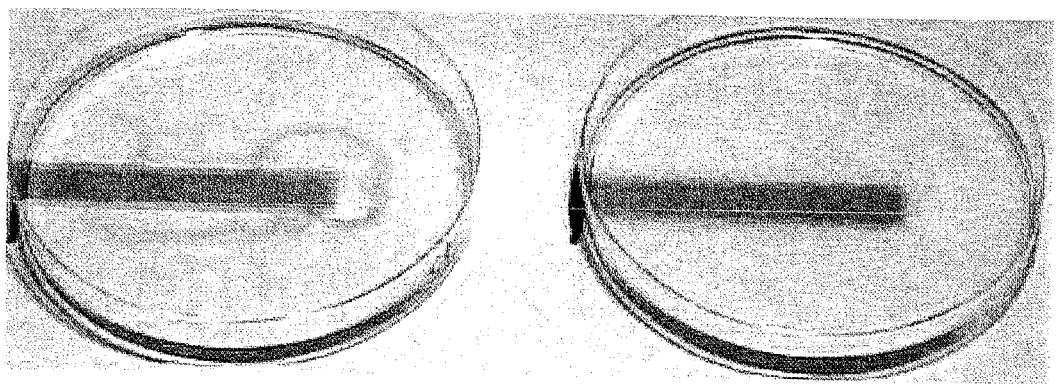
FIG. 4C-4D show an approximately 1 cm×10 cm cured strip of a composition formed from control composition 4 (C) and control composition 4 with 0.2% Polyfox 636 fluorinated surfactant (D) after cure.
Figure 4I:
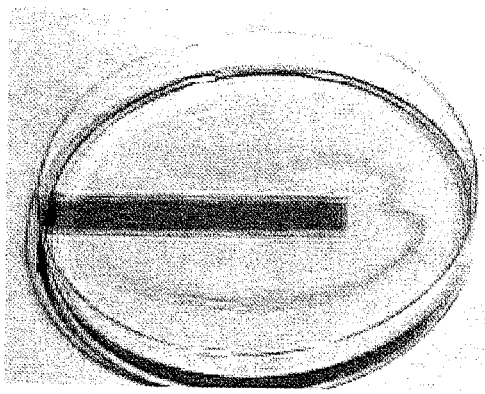
FIG. 4I-4J show an approximately 1 cm×10 cm cured strip of a composition formed from control composition 4 (I) and control composition 4 with 0.001% FC 4430 fluorinated surfactant (J) after cure.
Figure 4J:
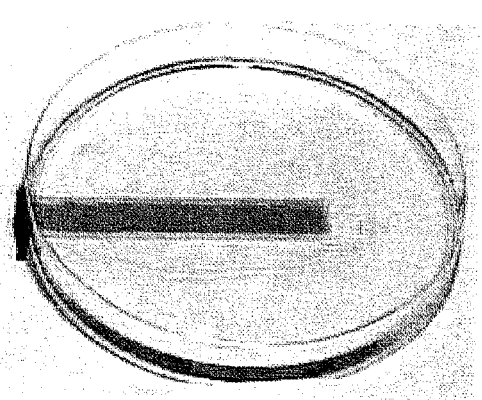
Figure 4K:
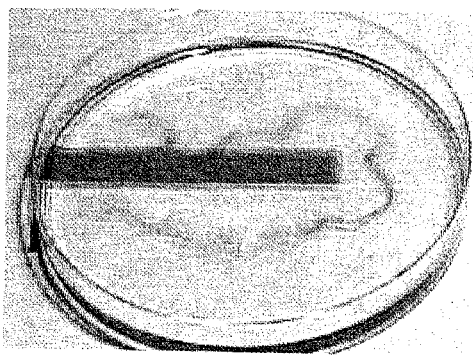
FIG. 4K-4L show an approximately 1 cm×10 cm cured strip of a composition formed from control composition 4 (K) and control composition 4 with 0.1% FC 4430 fluorinated surfactant (L) after cure.
Figure 4L:
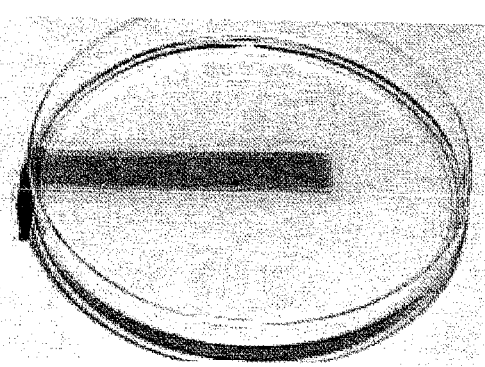
Figure 4M:
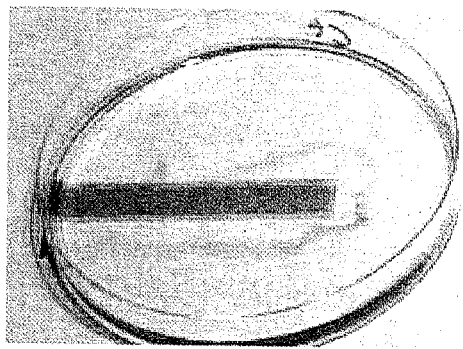
FIG. 4M-4N show an approximately 1 cm×10 cm cured strip of a composition formed from control composition 4 (M) and control composition 4 with 0.01% Polyfox 6320 fluorinated surfactant (N) after cure.
Figure 4N:
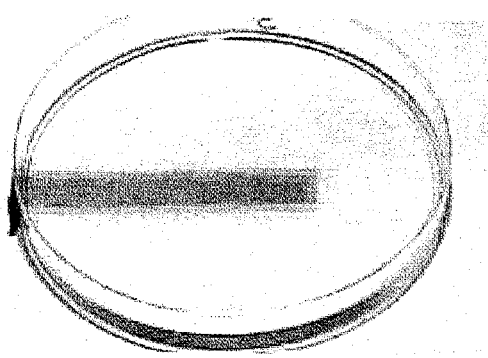
Figure 4O:
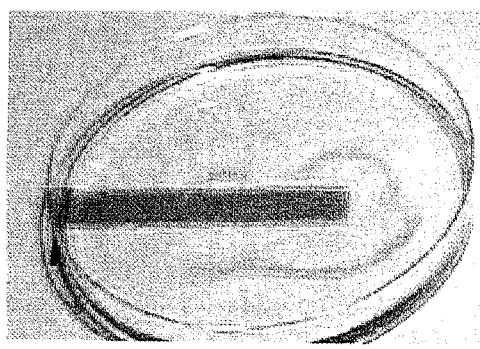
FIG. 4O-4P show an approximately 1 cm×10 cm cured strip of a composition formed from control composition 4 (O) and control composition 4 with 0.2% Polyfox 6320 fluorinated surfactant (P) after cure.
Figure 4P:
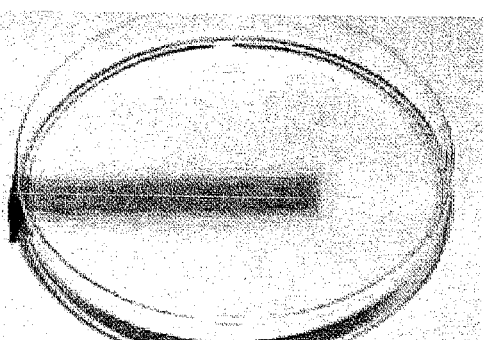
Figures 4Q, 4R:
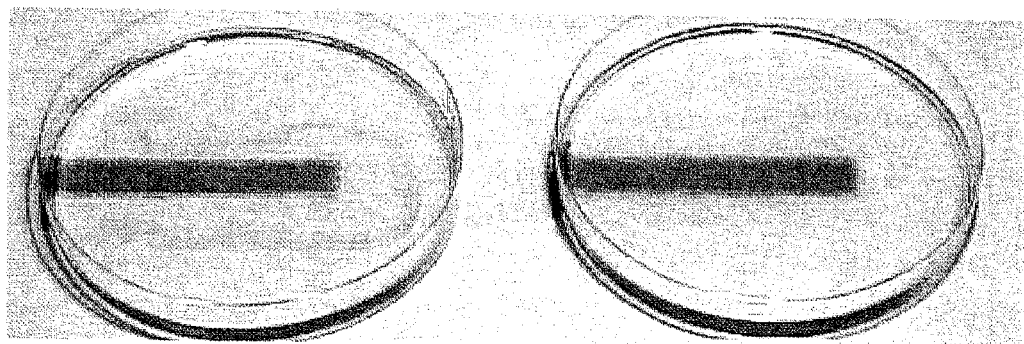
FIG. 4Q-4R show an approximately 1 cm×10 cm cured strip of a composition formed from control composition 4 (Q) and control composition 4 with 0.001% Polyfox 6520 fluorinated surfactant (R) after cure.
Figures 4S, 4T:
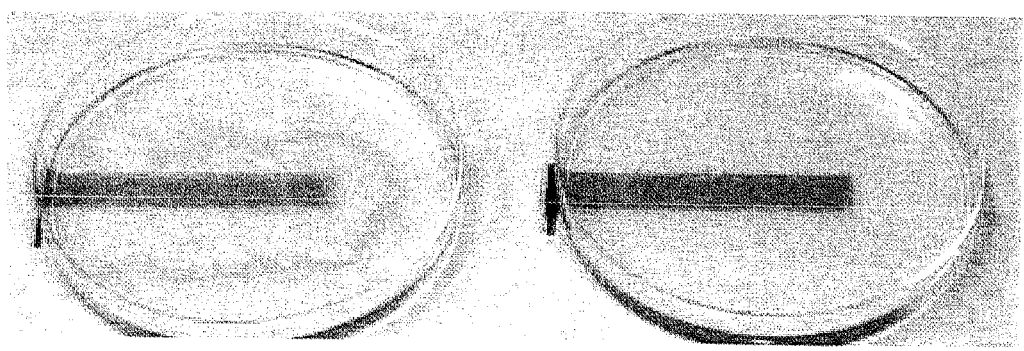
FIG. 4S-4T show an approximately 1 cm×10 cm cured strip of a composition formed from control composition 4 (S) and control composition 4 with 0.005% Polyfox 6520 fluorinated surfactant (T) after cure.
Figures 5A, 5B:
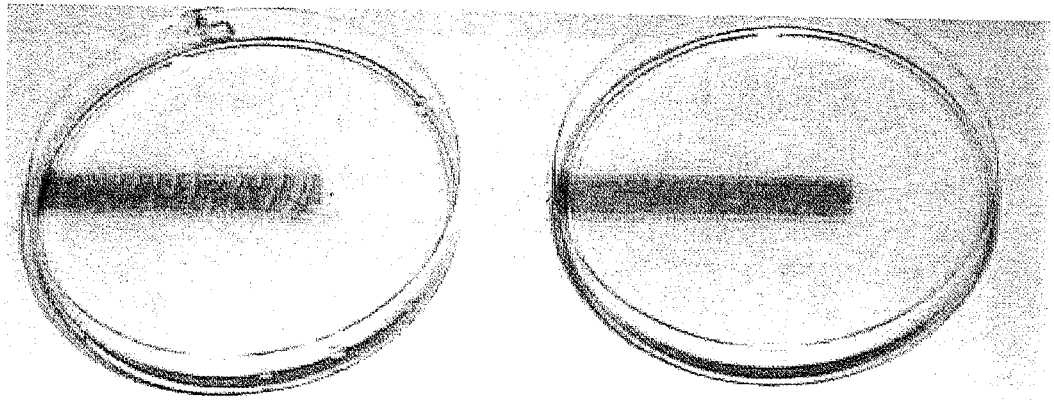
FIG. 5A-5B show an approximately 1 cm×10 cm cured strip of a composition formed from control composition 5 (A) and control composition 5 with 1% Polyfox 636 fluorinated surfactant (B) after cure.
Figures 5C, 5D:
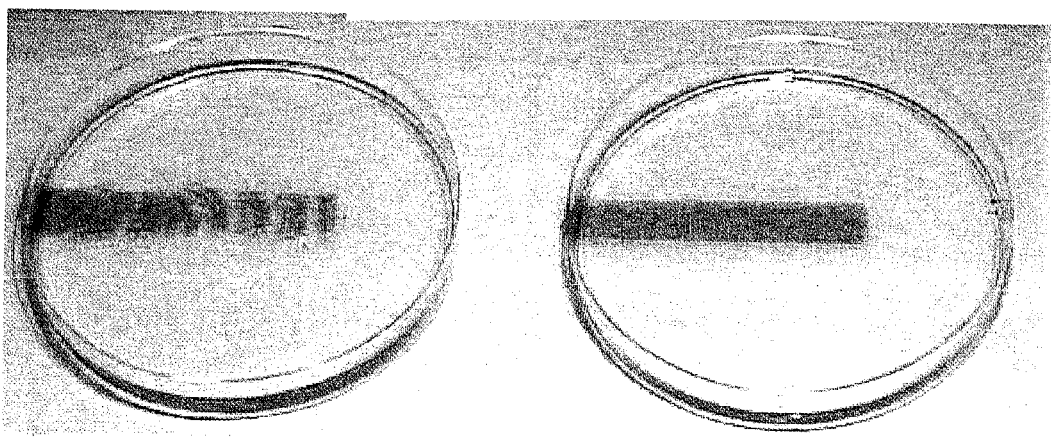
FIG. 5C-5D show an approximately 1 cm×10 cm cured strip of a composition formed from control composition 5 (C) and control composition 5 with 0.2% Polyfox 636 fluorinated surfactant (D) after cure.
Figures 5M, 5N:
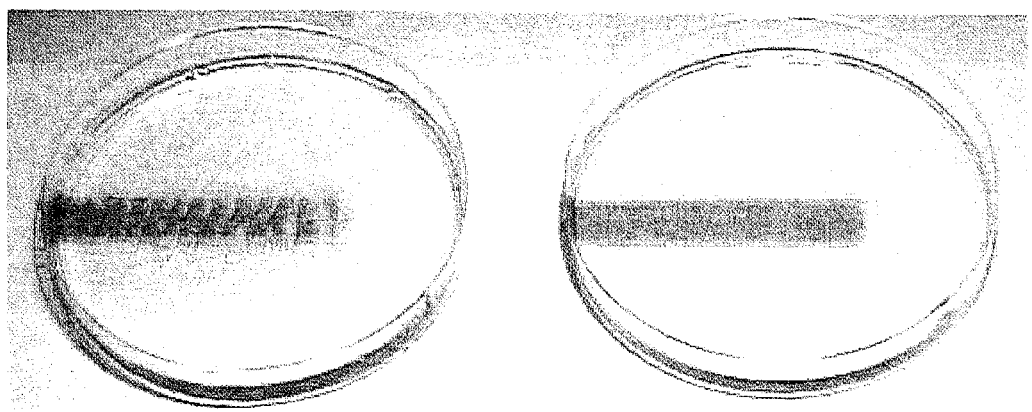
FIG. 5M-5N show an approximately 1 cm×10 cm cured strip of a composition formed from control composition 5 (M) and control composition 5 with 0.01% Polyfox 6320 fluorinated surfactant (N) after cure.
Figures 5O, 5P:
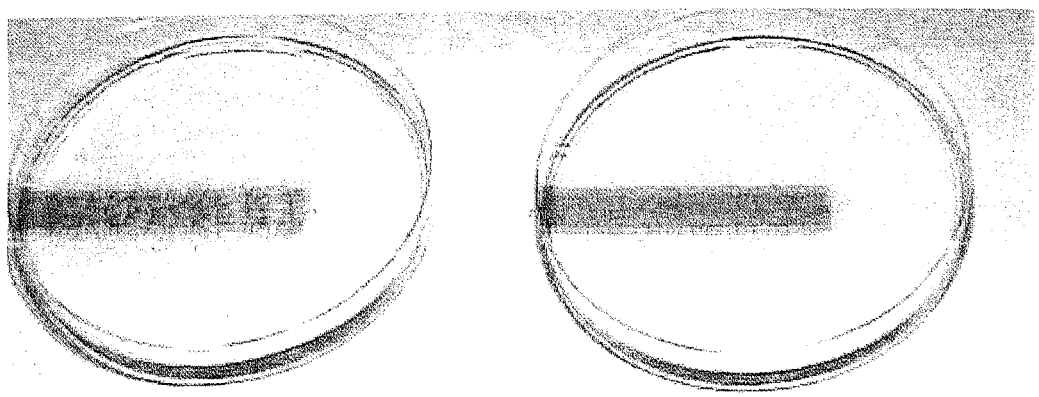
FIG. 5O-5P show an approximately 1 cm×10 cm cured strip of a composition formed from control composition 5 (O) and control composition 5 with 0.2% Polyfox 6320 fluorinated surfactant (P) after cure.
Figure 5Q:
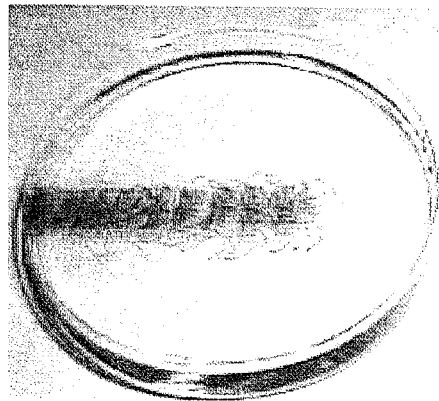
FIG. 5Q-5R show an approximately 1 cm×10 cm cured strip of a composition formed from control composition 5 (Q) and control composition 5 with 0.001% Polyfox 6520 fluorinated surfactant (R) after cure.
Figure 5R:
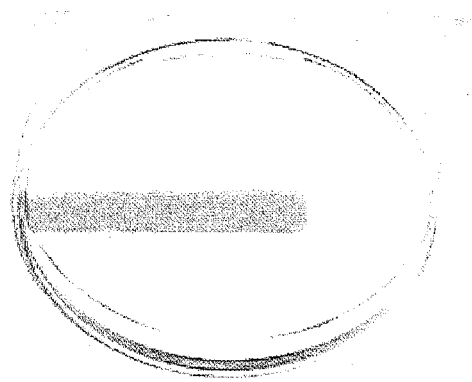
Figure 5S:
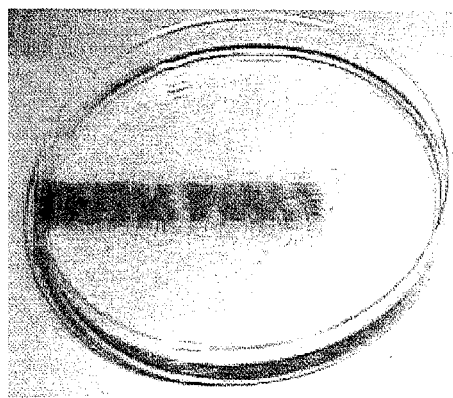
FIG. 5S-5T show an approximately 1 cm×10 cm cured strip of a composition formed from control composition 5 (S) and control composition 5 with 0.005% Polyfox 6520 fluorinated surfactant (T) after cure.
Figure 5T:
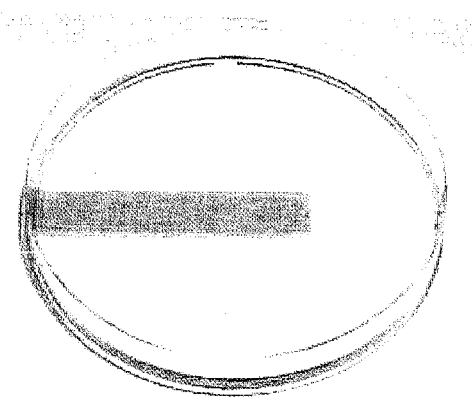
Figure 6A:
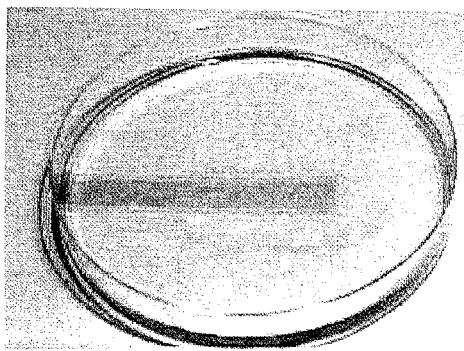
FIG. 6A-6B show an approximately 1 cm×10 cm cured strip of a composition formed from control composition 6 (A) and control composition 6 with 1% Polyfox 636 fluorinated surfactant (B) after cure.
Figure 6B:
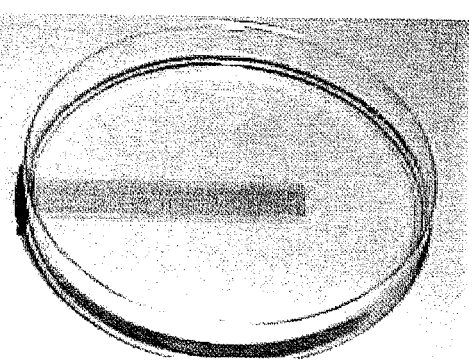
Figure 6C:
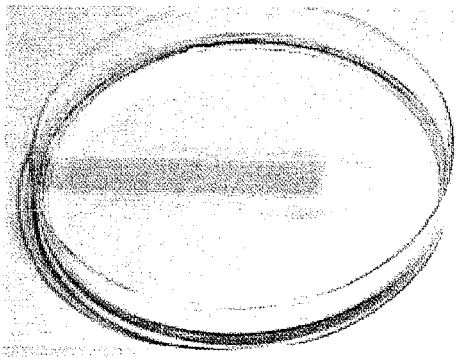
FIG. 6C-6D show an approximately 1 cm×10 cm cured strip of a composition formed from control composition 6 (C) and control composition 6 with 0.2% Polyfox 636 fluorinated surfactant (D) after cure.
Figure 6D:
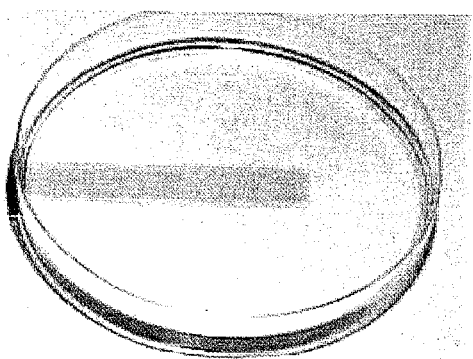
Figure 6E:
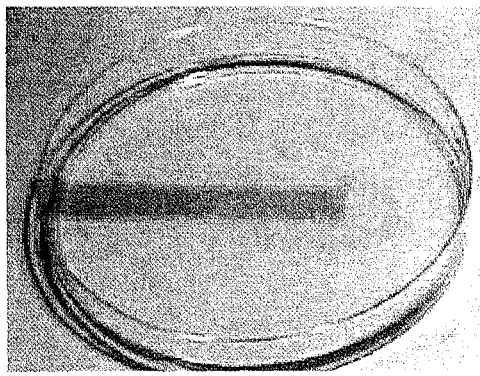
FIG. 6E-6F show an approximately 1 cm×10 cm cured strip of a composition formed from control composition 6 (E) and control composition 6 with 0.001% Polyfox 656 fluorinated surfactant (F) after cure.
Figure 6F:
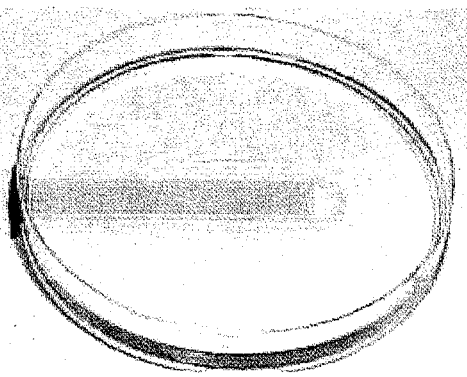
Figure 6G:
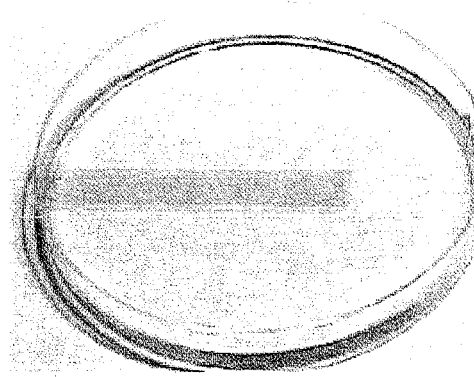
FIG. 6G-6H show an approximately 1 cm×10 cm cured strip of a composition formed from control composition 6 (G) and control composition 6 with 0.1% Polyfox 656 fluorinated surfactant (H) after cure.
Figure 6H:
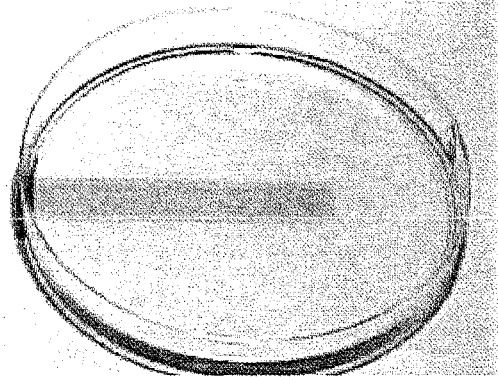
Figure 6I:
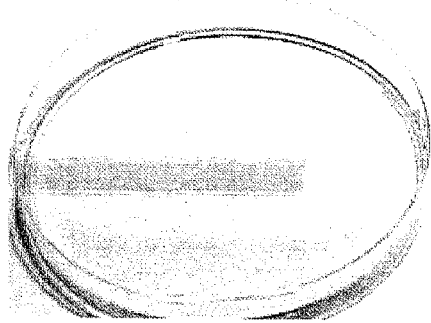
FIG. 6I-6J show an approximately 1 cm×10 cm cured strip of a composition formed from control composition 6 (I) and control composition 6 with 0.001% FC 4430 fluorinated surfactant (J) after cure.
Figure 6J:
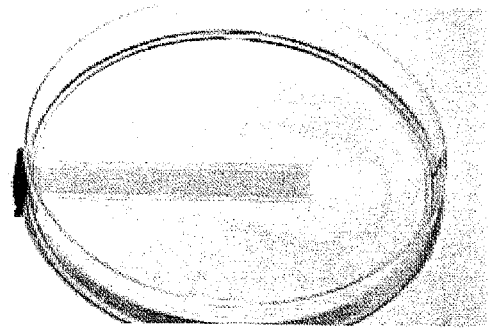
Figure 6K:
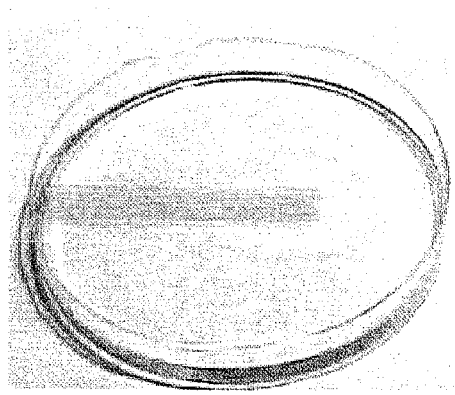
FIG. 6K-6L show an approximately 1 cm×10 cm cured strip of a composition formed from control composition 6 (K) and control composition 6 with 0.1% FC 4430 fluorinated surfactant (L) after cure.
Figure 6L:
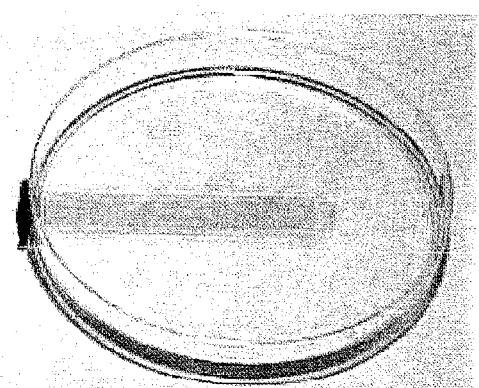
Figure 6M:
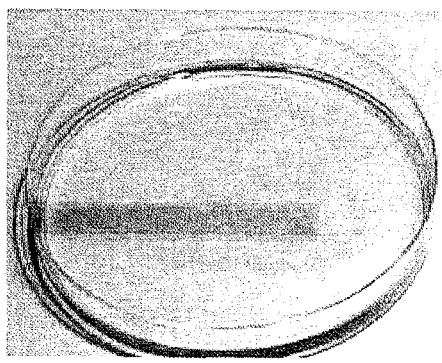
FIG. 6M-6N show an approximately 1 cm×10 cm cured strip of a composition formed from control composition 6 (M) and control composition 6 with 0.01% Polyfox 6320 fluorinated surfactant (N) after cure.
Figure 6N:
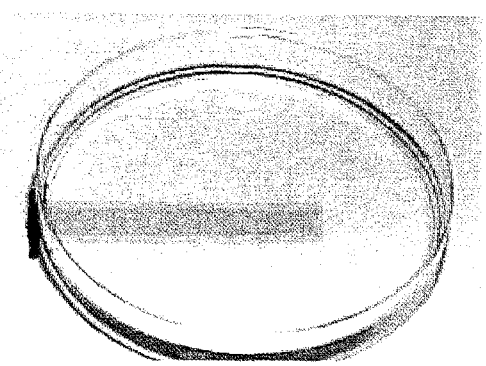
Figure 6O:
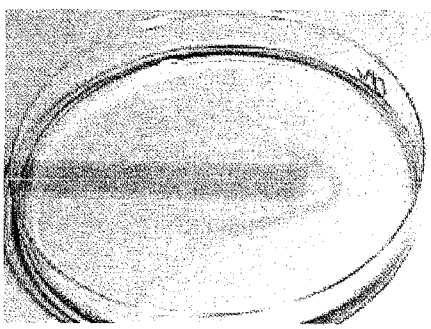
FIG. 6O-6P show an approximately 1 cm×10 cm cured strip of a composition formed from control composition 6 (O) and control composition 6 with 0.2% Polyfox 6320 fluorinated surfactant (P) after cure.
Figure 6P:
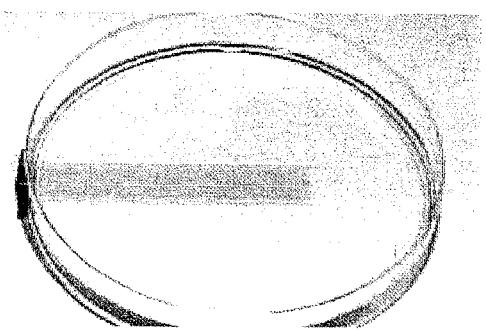
Figure 6Q:
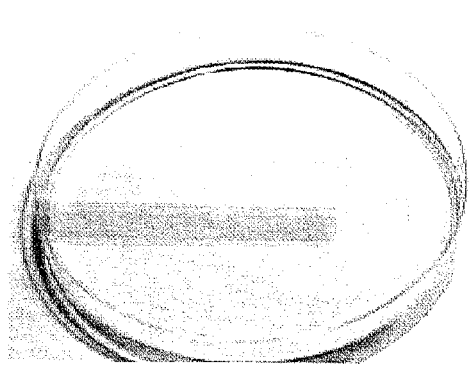
FIG. 6Q-6R show an approximately 1 cm×10 cm cured strip of a composition formed from control composition 6 (Q) and control composition 6 with 0.001% Polyfox 6520 fluorinated surfactant (R) after cure.
Figure 6R:
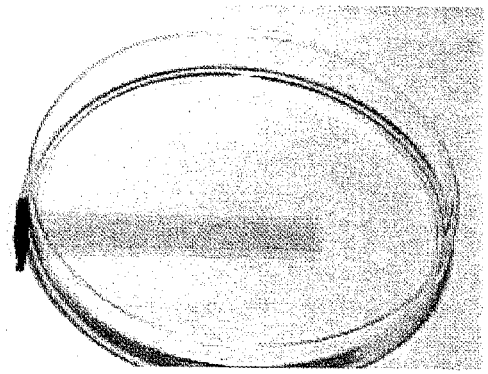
Figure 6S:
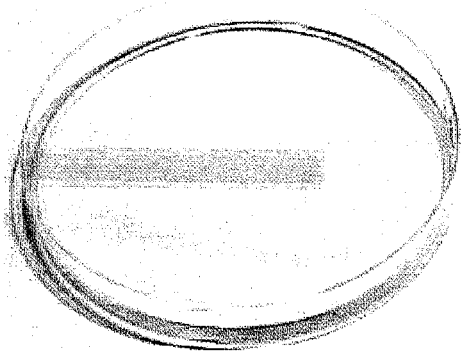
FIG. 6S-6T show an approximately 1 cm×10 cm cured strip of a composition formed from control composition 6 (S) and control composition 6 with 0.005% Polyfox 6520 fluorinated surfactant (T) after cure.
Figure 6T:
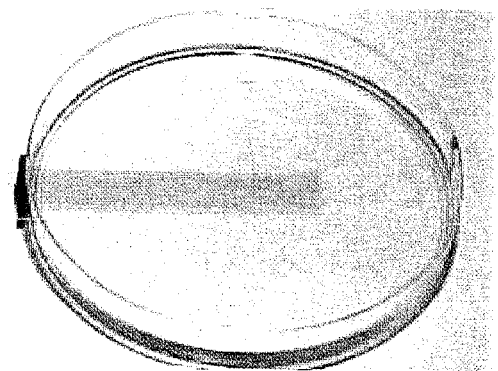

Table Notes: These Examples are depicted in the Figures attached to this specification according to their Composition numbers and Figure letters. For Example, FIG. 1A depicts Composition 1 and Control (A). Similarly, FIG. 2H represents Composition 2 control w/0.1% Polyfox 656 (H).

All materials used in the examples are readily available from standard commercial sources, unless otherwise specified. All percentages are by weight unless otherwise indicated. The following additional terms and materials were used:

ND means Not Determined.
UVR-6105 is 3,4-Epoxycyclohexylmethyl-3,4-epoxycyclohexane carboxylate from Dow, Danbury Conn.
SR-9003 is Neopentylglycol diacrylate from Sartomer, Exton Pa.
Terathane 250 is poly(Tetrahydrofuran) with MW average of 250 from Dupont, Wilmington Del.
UVR 6000 is 3-ethyl-3-hydroxymethyl-oxetane obtained from Dow
CPI-1176 is mixed Triaryl sulfonium salts of Hexafluoroantimonate dissolved in Propylene Carbonate obtained from Chitec Technology Co., Ltd. 7F, 58, Lane 148, Li De Street, Chung Ho, Taipei Hsien, 235, Taiwan. R.O.C.
BMPS is Tribromomethylphenylsulphone obtained from Charkit Chemical Corporation, Darien Conn.
Triazine Y is (—S Triazine 2 (Stylbene) 4,6-Trichloromethyl obtained from Charkit
Rhodorsil 2074 is (tolylcumyl) iodonium tetrakis(pentafluorophenyl) borate obtained from Rhodia, Rock Hill S.C.
IR-500 is Irgacure 500 a 50:50 mixture of 1-hydroxycyclohexyl phenyl ketone and benzophenone obtained from Ciba
IR-184 is Irgacure 184, which is 1-hydroxycyclohexyl phenyl ketone, obtained from Ciba
Chivacure® BMS or BMS is 4-Benzoyl-4'-methyldiphenyl sulfide obtainable from Chitec Technology Co. Ltd. 7F, 58, Lane 148, Li De Street, Chung Ho, Taipei Hsien, 235, Taiwan, R.O.C.
Copikem XX or 20 was obtained from Hilton Davis.
Polyfox 636 is believed to have a structure similar to Structure 1 where n=6. Polyfox materials were obtained from Omnova.
Polyfox 6320 is believed to have a structure similar to Structure 1 where n=20.
Polyfox 656 is believed to have a structure similar to Structure 2 where n=6.
Polyfox 6520 is believed to have a structure similar to Structure 2 where n=20.
FC-4430 is a mixture of proprietary Fluoroaliphatic Polymeric Esters, proprietary polyether polymer, 1-Methyl-2-pyrrolidone, Toluene, and 2-Propenoic Acid, 2-[methyl[(nonafluorobutyl)sulfonyl]amino]ethyl ester obtained from 3M St. Paul Minn.
Vikalox 14 (obtained from Elf Atochem, Philadelphia Pa.) is 1,2 Tetradecane Oxide
Epon 825 (Obtained from Resolution Performance Co., Houston Tex.) is a Bisphenol A diglycidyl ether.
UVR 6105 (Dow, Danbury Conn.) is 3,4-Epoxycyclohexylmethyl-3,4-epoxycyclohexane Carboxylate.

DPHA (obtained from Sartomer, Exton Pa.) is Dipentaerythritol Hexacrylate.

Irgacure 1173 (Ciba, Hawthorne N.Y.) is 2-Hydroxy-2-2 methyl-1-phenyl-propan-1-one.

BYK-A501 (obtained from BYK Chemie, Wallingford Conn.) is a mixture of Solvent Naptha, 2,6-Di-tert-butyl-p-cresol, and 2-methoxy-1-Methylethyl Acetate.

Silwet L 7600 (a surfactant obtained from OSI Specialties, Danbury Conn.) is a mixture of Polyalkyleneoxide Modified Polydimethylsiloxane and Poly(oxy-1,2-ethanediyl), a-methyl-w-(2-propenyloxy)-.

PVP is polyvinylpyrrolidone obtained from Aldrich, Saint Louis Mo.

Comparative Example A

The following procedure and formulation was used in a stereolithography process. First the photospeed of the composition was measured by performing the following steps.

1. A petri dish of composition was placed in the image plane within a stereolithography chamber that had a temperature of approximately 30° C. and relative humidity of approximately 30%.

2. The surface of the composition was exposed to a series of six exposures, where each exposure was a square approximately 1.27 cm on a side. The six exposures were approximately 31.9, 40, 47.5, 59, 79, and 94.5 mJ/cm$^2$. The exposures were made with a frequency tripled Solid State laser beam having an approximate wavelength output of 355.4 nm and power of 115 mW at the image plane. The beam was focused to approximately 0.022 cm at the image plane and the laser had a pulse frequency of 80 kHz. Each exposure was conducted in a line-by-line manner with the beam scanned in the Y-direction and then advanced in the X direction in 0.0051 cm increments.

3. After 15 minutes, the squares were removed from the petri dish and blotted with a paper towel. The thickness of each square was measured utilizing Mitutoyo Model NTD12-8#C digital spring loaded calipers.

4. A least squares fit line of the natural-log-of-exposure vs. thickness-measured gave "Working Curve" values of approximately 11.18 mJ/cm$^2$ for Ec and approximately 0.022 cm for Dp. Such a Working Curve characterization is standard in the stereolithographic art where the Ec is the minimum energy to theoretically convert monomer to polymer and Dp is the slope of the least squares fit line of the working curve.

Next, within the chamber, a vat of the composition was provided in which a platform was placed that was substantially co-planar with the surface of the composition of the vat. The platform was dipped below the surface of the composition and raised to approximately 0.02 cm lower than the composition surface. Then the composition was smoothed with a doctor blade to create a substantially uniform layer approximately 0.02 cm thick on the platform surface.

Next, the layer of composition was exposed imagewise with a frequency tripled Solid State laser beam having an approximate wavelength output of 355.4 nm and power of 110 mW at the image plane. The beam was focused to approximately 0.022 cm at the image plane composition surface and the laser had a pulse frequency of 80 kHz. The exposure was conducted in a line-by-line manner with the beam scanned in the Y-direction and incremented in the X direction. The incrementation was spaced approximately 0.0076 cm apart. An exposure of 50.35 mJ/cm$^2$ was provided to the composition within the image region in order to induce photohardening imagewise. Such exposure is capable of hardening the composition to approximately 0.033 cm.

Therefore the composition was given approximately 0.013 cm extra exposure than needed to harden the 0.02 cm layer. This extra exposure assures adhesion to the platform or adhesion to previous layers.

After the imagewise exposure, the platform was again dipped below the surface of the composition, allowing unexposed composition to coat the platform or previously exposed layer surface. Then the platform was brought back up such that the surface of the previously exposed layer was approximately 0.02 cm below the composition surface. Again the doctor blade was used to smooth the composition forming a layer approximately 0.02 cm thick above the previously imaged layer surface. Then a new imagewise exposure of approximately 50.35 mJ/cm$^2$ was provided to the composition surface. The process was continued until tensile bars (ASTM D638M Type M1 approximately 1 cm thick) were fabricated. After fabrication, the bars were removed from the platform, cleaned in propylene carbonate, rinsed in isopropyl alcohol, and then allowed to dry. Finally the tensile bars were post-exposed in a RCA (obtained from 3-D Systems) for one hour. Other shape parts were also made. Following is the composition:

TABLE 5

Stereolithography Composition with Poor Diffusional Resolution
Comparative Example A

| Component | % |
|---|---|
| Epon 825 | 47.040 |
| UVR 6105 | 15.000 |
| UVR-6000 | 22.000 |
| DPHA | 8.000 |
| SR 9003 | 5.000 |
| Irgacure 1173 | 1.560 |
| BMS | 0.175 |
| Rhodorsil 2074 | 1.000 |
| BYK-A501 | 0.020 |
| Silwet L 7600 | 0.200 |
| PVP | 0.005 |

The fabricated parts exhibited poor resolution, especially on the trailing image edges normal to the scan sweep direction. On these edges, especially in regions where large flat regions (greater than 0.5 cm) were fabricated, a gel material was formed. This gel survived the cleaning process and was later hardened during post-UV exposure. Other part edges were rough as well. This created a part with poor image fidelity.

Next, Polyfox 6520, having the following (assumed) structure,

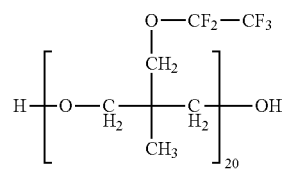

was dissolved in the composition of Comparative Example A at a concentration of 0.002% by weight. Parts were fabricated using the same exposure and other process variables as used in Comparative Example A. The parts showed improved diffusional resolution, did not have the gel on the trailing edges of the scan, and had smoother sidewalls.

Addition of the Polyfox 6520 can cause other problems related to surface cratering in some formulations. In some cases, there appears to be an interaction with other defoamers and/or surfactants that lead to these undesirable surface defects. These fluorinated surfactants surprisingly have some degree of defoaming action and may eliminate the need for other defoamers or surfactants. It is possible to formulate compositions that avoid these defects. In addition, including approximately 1 wt. % of other surfactants such as an acrylate copolymer surfactant, for example, BYK 361N (BYK Chemie, Wallingford, Conn.) can improve surface properties, such as smoothing the resin surface and removing excess beaded resin on smooth faces.

Following in Tables 6-9 are examples of other formulations and some of their properties.

TABLE 6

Composition Examples 7-15

| Component | Ex. 7 % | Ex. 8 % | Ex. 19 % | Ex. 10 % | Ex. 11 % | Ex. 12 % | Ex. 13 % | Ex. 14 % | Ex. 15 % |
|---|---|---|---|---|---|---|---|---|---|
| Epon 825 | 55.863 | 55.864 | 56.759 | 56.7595 | 55.259 | 55.363 | 51.14 | 51.86 | 54.040 |
| UVR 6105 | 10.000 | 10.000 | 10.000 | 10.000 | 10.000 | 10.000 | 10.000 | 10.000 | 15.000 |
| ViKOLOX 14 | 5.000 | 5.000 | 5.000 | 5.000 | 5.000 | 5.000 | 5.000 | 5.000 | |
| UVR-6000 | 18.000 | 18.000 | 18.000 | 18.000 | 19.500 | 18.000 | 18.000 | 18.000 | 22.000 |
| DPHA | 6.000 | 6.000 | 8.000 | 8.000 | 8.000 | 6.000 | 10.000 | 10.000 | 6.000 |
| SR-9003 | | | | | | | | | |
| Irgacure 184 | | | | | | | | | |
| Irgacure 1173 | 4.500 | 4.500 | 1.560 | 1.560 | 1.560 | 4.500 | 4.720 | 4.500 | 1.560 |
| Chivacure BMS | 0.130 | 0.130 | 0.175 | 0.175 | 0.175 | 0.130 | 0.134 | 0.130 | 0.175 |
| Chitec BF-1172 | | | | | | | | | |
| Rhodorsil 2074 | 0.500 | 0.500 | 0.500 | 0.500 | 0.500 | 1.000 | 1.000 | 0.500 | 1.000 |
| Silwet L 7600 | | | | | | | | | 0.200 |
| Polyfox 6520 | 0.0020 | 0.0005 | 0.001 | 0.0005 | 0.001 | 0.0020 | 0.001 | 0.001 | |
| BYK-A501 | | | | | | | | | 0.020 |
| PVP | 0.005 | 0.005 | 0.005 | 0.005 | 0.005 | 0.005 | 0.005 | 0.005 | 0.005 |

TABLE 7

Properties of Composition Examples 7-15

| | Ex. 7 | Ex. 8 | Ex. 9 | Ex. 10 | Ex. 11 | Ex. 12 | Ex. 13 | Ex. 14 | Ex. 15 |
|---|---|---|---|---|---|---|---|---|---|
| 1 week + Tensile Modulus GPa | 2.523 | 2.661 | 2.813 | 2.882 | 2.964 | 3.164 | 1.455 | 1.586 | 3.847 |
| 1 week + Tensile Elongation Avg. % | 5.5 | 5.9 | 5.2 | 4.2 | 4.3 | 5.66 | 16 | 6.6 | 1.7 |
| 1 week + Tensile Elongation Max % | 7.5 | 7.2 | 5.9 | 5 | 4.8 | 8.3 | 20.3 | 8.3 | 2.4 |
| Fabrication Chamber Temp. °C. | 35 | 30 | 30 | 30 | 30 | 35 | 30 | 30 | 30 |
| Dp mm | 0.208 | 0.190 | 0.204 | ND | 0.204 | 0.200 | 0.187 | 0.186 | 0.212 |
| E10 (mJ/cm^2) | 29.61 | 38.32 | 49.58 | ND | 49.58 | 36.59 | 28.67 | 29.18 | 38.53 |

TABLE 8

Compositions Examples 16-24

| Component | Ex. 16 % | Ex. 17 % | Ex. 18 % | Ex. 19 % | Ex. 20 % | Ex. 21 % | Ex. 22 % | Ex. 23 % | Ex. 24 % |
|---|---|---|---|---|---|---|---|---|---|
| Epon 825 | 55.614 | 47.239 | 55.364 | 47.259 | 47.038 | 52.540 | 41.825 | 47.009 | 46.755 |
| UVR 6105 | 10.000 | 15.000 | 10.000 | 15.000 | 15.000 | 15.000 | 15.000 | 15.000 | 8.000 |
| ViKOLOX 14 | 5.000 | | 5.000 | | | | 7.000 | | |
| UVR-6000 | 18.000 | 22.000 | 18.000 | 22.000 | 22.000 | 22.000 | 21.000 | 22.000 | 30.000 |
| DPHA | 6.000 | 8.000 | 6.000 | 8.000 | 8.000 | 8.000 | 8.000 | 8.000 | 8.000 |
| SR-9003 | | 5.000 | | 5.000 | 5.000 | | | 5.000 | |
| Irgacure 184 | | | | | | | 1.680 | | 1.160 |
| Irgacure 1173 | 4.500 | 1.560 | 4.500 | 1.560 | 1.560 | 1.560 | | 1.560 | |
| Chivacure BMS | 0.130 | 0.175 | 0.130 | 0.175 | 0.175 | 0.175 | | 0.175 | |
| Chitec BF-1172 | | | | | | | 5.270 | | 5.860 |
| Rhodorsil 2074 | 0.750 | 0.500 | 1.000 | 1.000 | 1.000 | 0.500 | | 0.750 | |
| Silwet L 7600 | | 0.500 | | | 0.200 | 0.200 | 0.200 | 0.500 | 0.200 |
| Polyfox 6520 | 0.0005 | 0.001 | 0.0005 | 0.001 | 0.002 | | | 0.001 | |
| BYK-A501 | | 0.020 | | | 0.020 | 0.020 | 0.020 | | 0.020 |
| PVP | 0.005 | 0.005 | 0.005 | 0.005 | 0.005 | 0.005 | 0.005 | 0.005 | 0.005 |

TABLE 9

Properties of Composition Examples 16-24

|  | Ex. 16 | Ex. 17 | Ex. 18 | Ex. 19 | Ex. 20 | Ex. 21 | Ex. 22 | Ex. 23 | Ex. 24 |
| --- | --- | --- | --- | --- | --- | --- | --- | --- | --- |
| 1 week + Tensile Modulus Gpa | 3.178 | 3.185 | 3.213 | 3.219 | 3.537 | 3.736 | 1.627 | 3.440 | 3.530 |
| 1 week + Tensile Elongation Avg. % | 5.8 | 3 | 4.9 | 3.3 | 2.7 | 3.2 | 3.8 | 1.2 | 3 |
| 1 week + Tensile Elongation Max % | 6.4 | 5.3 | 6.9 | 4 | 4.2 | 5.5 | 5.3 | 0.85 | 3.6 |
| Fabrication Chamber Temp. ° C. | 30 | 30 | 30 | 30 | 30 | 30 | 30 | 30 | 30 |
| $D_p$ mm | 0.186 | ND | 0.187 | 0.193 | 0.219 | 0.200 | 30 | 0.212 | 0.207 |
| E10 (mJ/cm$^2$) | 37.63 | ND | 37.99 | 39.21 | 35.58 | 45.95 | 0.195 | 41.03 | 61.19 |

Examples 25-29

A "No Initiator" variation of a similar formulation to the above formulations was prepared to evaluate the effects of BMS and Irgacure 1173 on the parameters of the formulations:

TABLE 10

Example Formulation Without Photoinitiator
No Initiator Mix

| Component | % |
| --- | --- |
| Epon 825 | 60.1025 |
| UVR 6105 | 10.2286 |
| UVR-6000 | 18.4115 |
| DPHA | 6.1372 |
| Vikolox 14 | 5.1143 |
| Polyfox 6520 | 0.0005 |
| PVP | 0.0054 |

To this mixture various amount of initiator, and Irgacure 1173 were added. The addition was based upon a ratio of light absorption of BMS to the light absorption of Irgacure 1173 based upon spectrophotometer measurements. This is listed as, for example BMS/1173=4, which means that the BMS is absorbing 4 times the amount of light energy (or 80%) compared to the light energy absorbed by Irgacure 1173.

TABLE 11

Improved Cure Speed from Combinations of Irgacure 1173 and BMS

| Component | Example 25 | Example 26 | Example 27 | Example 28 | Example 29 |
| --- | --- | --- | --- | --- | --- |
| No Initiator Mix | 97.765% | 97.396% | 96.760% | 95.5% | 94.87% |
| Irgacure 1173 | 1.55% | 1.94% | 2.590% | 3.89% | 4.5% |
| BMS | 0.175% | 0.164% | 0.145% | 0.11% | 0.13% |
| Rhodorsil 2074 | 0.5% | 0.5% | 0.5% | 0.5% | 0.5% |
| Property |  |  |  |  |  |
| Ratio of light absorption BMS/1173 | 4:1 | 3:1 | 2:1 | 1:1 | 1:1 |
| Dp cm | N/M | 0.023 | 0.022 | 0.023 | 0.019 |
| E10 mJ/cm$^2$ | N/M | 53 | 49 | 41 | 42 |

In the first case where the ratio of light absorption by BMS/1173=4, a working curve could not be measured. In the other cases, the E10 value represents the working-curve-derived predicted-energy-required to produce a 0.0254 cm thick layer of polymer. The lower the E10 value the faster the photospeed and the shorter the imaging time for the process.

In the formulations, although the Rhodorsil 2074 is effective at levels above 0.25%, the cationic cure is improved at higher concentrations. The concentration of 0.5% is most preferred from a cost standpoint but levels of 0.75 and 1% or higher are also useful. The concentrations to be used with Irgacure 250 would be similar.

Test Methods

1. Tensile Modulus and Elongation: All tensile properties as discussed herein were measured according to ASTM Test D638M1 with the only differences from the test method being that the temperature was in the range between 22 and 24° C. and the Relative Humidity was kept at a humidity between 30 and 50% RH.

2. $D_p$ and E10: These properties were measured as part of working curve determinations for each composition as described in the discussion accompanying Comparative Example A. E10 represents the exposure associated with a 10 mil thickness on the least squares fit line of the graph of natural log of exposure versus measured thickness Although illustrated and described herein with reference to certain specific embodiments, the present invention is nevertheless not intended to be limited to the details shown. Rather, various modifications may be made in the details within the scope and range of the equivalents of the claims without departing from the spirit of the invention.

The invention claimed is:

1. A method of forming a three-dimensional article via stereolithography comprising the steps of:

(1) coating a layer of a composition onto a surface, said composition comprising

[a] a single cationic photoinitiator, said cationic photoinitiator being (tolylcumyl)iodonium tetrakis(pentafluorophenyl)borate,

[b] an epoxide,

[c] a photosensitizer component having the following chemical formula:

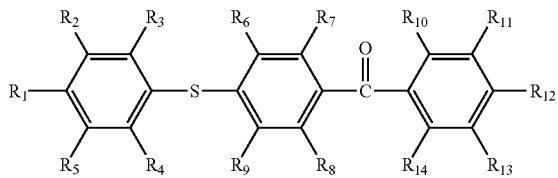

wherein $R_1$-$R_{14}$ are independently H or $C_1$-$C_8$ saturated or unsaturated, branched or unbranched, substituted or unsubstituted hydrocarbyl; and
[d] a free radical photoinitiator component that is different than the photosensitizer component;
(2) exposing the layer imagewise to actinic radiation to form an imaged cross-section, wherein the actinic radiation provides sufficient exposure to cause substantial curing of the layer in the exposed areas;
(3) coating a layer of said composition onto the previously exposed imaged cross-section;
(4) exposing the layer from step (3) imagewise to actinic radiation to form an additional imaged cross-section, wherein the radiation is of sufficient intensity to cause substantial curing of the layer in the exposed areas and to cause adhesion to the previously exposed imaged cross-section; and
(5) repeating steps (3) and (4) a sufficient number of times in order to build up a three-dimensional article.

2. The method of claim 1, wherein said composition is antimony-free.

3. The method of claim 1, wherein said composition further comprises an acrylate.

4. The method of claim 1, wherein said photosensitizer comprises 4-benzoyl-4-methyldiphenyl sulfide.

5. The method of claim 1, wherein the free radical photoinitiator component that is different than the photosensitizer component is 2-Hydroxy-2-2 methyl-1-phenyl-propan-1-one.

6. The method of claim 1, wherein said composition further comprises an oxetane.

7. The method of claim 1, wherein said composition further comprises a photoacid diffusion inhibitor.

8. The method of claim 7, wherein said photoacid diffusion inhibitor comprises a fluorinated polymer.

9. The method of claim 7, wherein said photoacid diffusion inhibitor comprises a fluorinated surfactant.

10. The method of claim 1, wherein said composition further comprises a photoacid diffusion inhibitor comprising a fluorinated polymer surfactant without a linking ester group.

11. The method of claim 10, wherein said photoacid diffusion inhibitor is 1.0 wt. % or less of said composition.

12. The method of claim 5, wherein the ratio by weight, relative to the total composition, of the free-radical photoinitiator component [d] to the photosensitizer component [c] is greater than 9:1.

13. The method of claim 10, wherein said composition has an improved diffusional resolution over an identical composition exclusive of the photoacid diffusion inhibitor.

14. The method of claim 10, wherein said composition further comprises glycidyl epoxide monomers.

15. The method of claim 10, wherein said photoacid diffusion inhibitor contains fluorinated moieties having the following formula $C_k F_m$ wherein m has a value of 3-5 and k has a value of 1 or 2.

16. The method of claim 10, wherein said moieties are part of a repeating group that is repeated at least 5 times.

17. The method of claim 10, wherein, said photosensitizer comprises 4-benzoyl-4-methyldiphenyl sulfide.

* * * * *